(12) United States Patent
Konstantinov

(10) Patent No.: US 8,785,945 B2
(45) Date of Patent: Jul. 22, 2014

(54) SIC BIPOLAR JUNCTION TRANSISTOR WITH OVERGROWN EMITTER

(71) Applicant: Fairchild Semiconductor Corporation, San Jose, CA (US)

(72) Inventor: Andrei Konstantinov, Sollentuna (SE)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/688,067

(22) Filed: Nov. 28, 2012

(65) Prior Publication Data

US 2013/0087808 A1    Apr. 11, 2013

Related U.S. Application Data

(63) Continuation of application No. PCT/SE2012/050097, filed on Jan. 31, 2012.

(60) Provisional application No. 61/437,835, filed on Jan. 31, 2011.

(30) Foreign Application Priority Data

Jan. 31, 2011    (SE) ........................................ 1150065

(51) Int. Cl.
*H01L 29/73*    (2006.01)

(52) U.S. Cl.
USPC ............................................ 257/77; 257/592

(58) Field of Classification Search
CPC .... H01L 29/73; H01L 29/66234; H01L 29/06
USPC ................. 257/592, 77, 586, 91, 92
See application file for complete search history.

(56) References Cited

U.S. PATENT DOCUMENTS

| 4,966,860 A | * | 10/1990 | Suzuki et al. | ................. 438/285 |
| 5,208,169 A | | 5/1993 | Shah et al. | |
| 5,386,140 A | * | 1/1995 | Matthews | ..................... 257/592 |

(Continued)

FOREIGN PATENT DOCUMENTS

| EP | 2192211 A1 | 6/2010 |
| JP | 2002-359378 A | 12/2002 |

(Continued)

OTHER PUBLICATIONS

Chapter II Demand filed Nov. 13, 2012, for International Application No. PCT/EP2012/051606, 20 pages.

(Continued)

*Primary Examiner* — Jarrett Stark
*Assistant Examiner* — Mohammad M Hoque

(57) ABSTRACT

New designs for silicon carbide (SiC) bipolar junction transistors (BJTs) and new methods of manufacturing such SiC BJTs are provided. The SiC BJT can include a collector region, a base region, and an emitter region where the collector region, the base region, and the emitter region are arranged as a stack. The emitter region can form an elevated structure defined by outer sidewalls disposed on the stack. The base region can have a portion interfacing the emitter region and defining an intrinsic base region. The intrinsic base region can include a first portion laterally spaced away from the outer sidewalls of the emitter region by a second portion of the base region that has a dopant dose higher than a dopant dose of the first portion.

31 Claims, 9 Drawing Sheets

(56) References Cited

U.S. PATENT DOCUMENTS

| | | | |
|---|---|---|---|
| 6,121,633 A * | 9/2000 | Singh et al. .................... 257/77 |
| 2001/0011729 A1 | 8/2001 | Singh et al. |
| 2003/0157777 A1 | 8/2003 | Van Zeghbroeck et al. |
| 2003/0160302 A1 | 8/2003 | Sankin et al. |
| 2009/0057685 A1 | 3/2009 | Mochizuki et al. |

FOREIGN PATENT DOCUMENTS

| | | |
|---|---|---|
| WO | 2010/024239 A1 | 3/2010 |
| WO | 2010/024240 A1 | 3/2010 |
| WO | 2010/110725 A1 | 9/2010 |

OTHER PUBLICATIONS

International Search Report and Written Opinion received for PCT Patent Application No. PCT/EP2012/051606, mailed on Apr. 18, 2012, 12 pages.

International Search Report and Written Opinion received for PCT Patent Application No. PCT/SE2012/050097, mailed on May 9, 2012, 10 pages.

Ahmed et al., "Characterization of the Static and Dynamic Behavior of a SiC BJT", 13th Power Electronics and Motion Control Conference, Sep. 1-3, 2008, pp. 2472-2477.

Lee, et al., "High-Current-Gain SiC BJTs With Regrown Extrinsic Base and Etched JTE", IEEE Transactions on Electron Devices, vol. 5 No. 8, Aug. 2008, pp. 1894-1898.

Zhang et al., "A High Current Gain 4H-SiC NPN Power Bipolar Junction Transistor", IEEE Electron Device Letters vol. 24 No. 5, May 2003, pp. 327-329.

International Preliminary Examination Report on Patentability for International Application No. PCT/EP2012/051606, Apr. 30, 2013, 15 pages.

Written Opinion of the International Preliminary Examining Authority received for PCT Application No. PCT/EP2012/051606, mailed on Jan. 17, 2013, 6 pages.

* cited by examiner

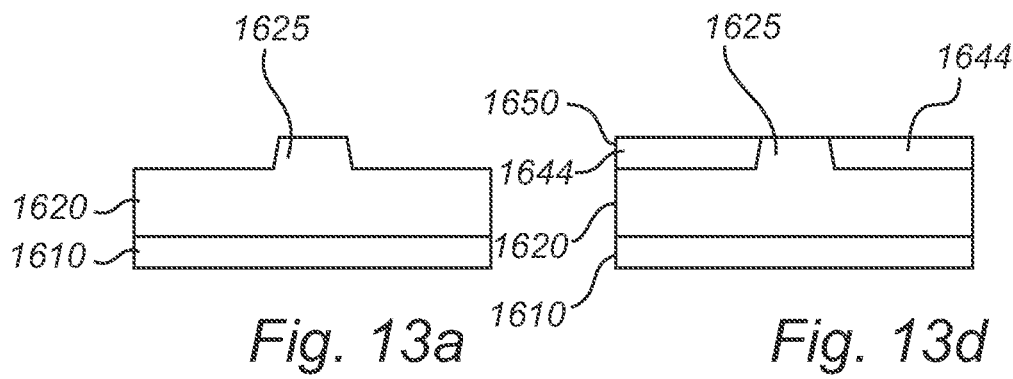
Fig. 13a
Fig. 13d
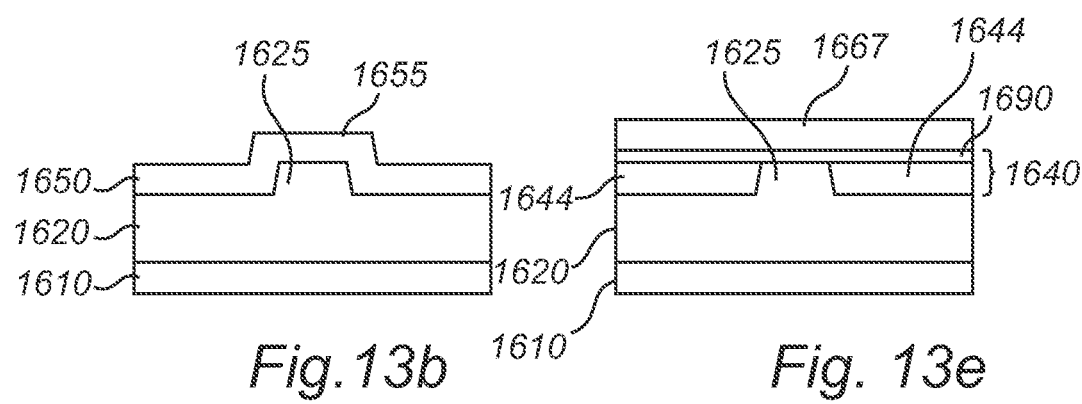
Fig. 13b
Fig. 13e
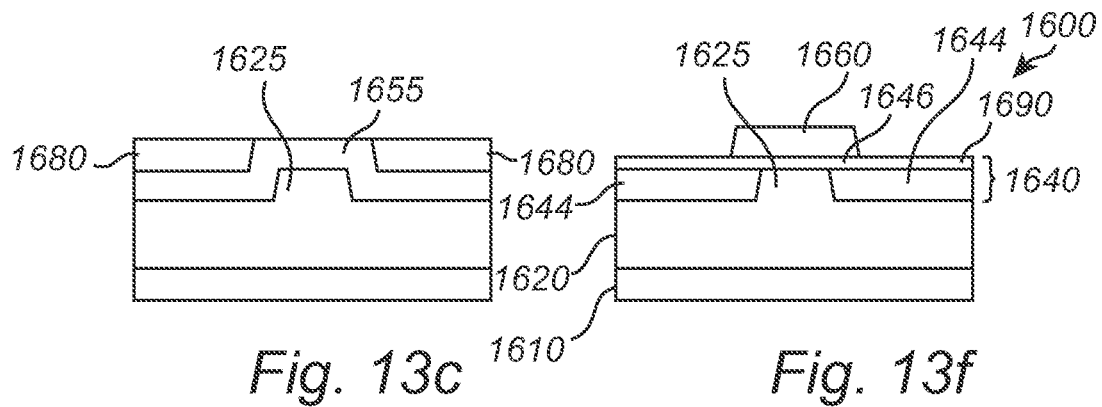
Fig. 13c
Fig. 13f

SiC BIPOLAR JUNCTION TRANSISTOR WITH OVERGROWN EMITTER

CROSS REFERENCE TO RELATED APPLICATIONS

This application is a continuation of PCT Patent Application No. PCT/SE 2011/050097, filed Jan. 31, 2012, entitled "SiC Bipolar Junction Transistor with Overgrown Emitter," which claims priority to U.S. Provisional Application No. 61/437,835, filed on Jan. 31, 2011 and which also claims priority to Swedish Application No. 1150065-9, filed on Jan. 31, 2011, all of which are incorporated by reference herein in their entirety.

TECHNICAL FIELD

The present disclosure relates to the field of high power semiconductor device technology and, in particular, to high power silicon carbide bipolar junction transistors. The present invention relates also to methods of manufacturing such silicon carbide bipolar junction transistors.

BACKGROUND

Silicon carbide (SiC) bipolar junction transistors (BJTs) are high-performance power devices having low on-state and switching losses and are also capable of high-temperature operation thanks to the high breakdown electric field, high thermal conductivity and high saturated drift velocity of electrons in SiC. SiC is a wide bandgap semiconductor and may advantageously be used for manufacturing devices for high power, high temperature and high frequency applications.

In a high power bipolar junction transistor (BJT) comprising a collector region, a base region and an emitter region, the critical characteristics representative of the performance of the BJT are the common emitter current gain, the specific on-resistance and the breakdown voltage. For a specific doping concentration, the base region of the BJT is preferably as thin as possible in order to obtain a high current gain. However, the minimum thickness of the base region is limited by the base punch-through effect, which represents total depletion of the base region at a high collector bias. Referring to the doping of the base layer, on the one hand, a high breakdown field requires a high doping level in the base region of the BJT in order to prevent early punch-through while, on the other hand, a high doping level in the base region decreases the emitter current gain, which is a disadvantage in practical application. A drawback of prior art SiC BJTs is therefore that they do not simultaneously provide a sufficiently high emitter current gain and a sufficiently high blocking voltage.

Yet another limitation of SiC bipolar technology originates from surface recombination which limits the achievable emitter current gain. Further, surface recombination is a potential stability issue, as the interface properties might degrade with time under the conditions of minority carrier injection.

Thus, there is a need for providing new designs of SiC BJTs and new methods of manufacturing such BJTs that would alleviate at least some of the above-mentioned drawbacks.

SUMMARY

Generally, it is an object of the present invention to provide a SiC BJT with improved blocking capabilities while still providing a sufficient current gain. Further, it is an object of the present invention to provide methods of manufacturing such a SiC BJT.

These and other objects of the present invention are achieved by means of the SiC BJT, a unit cell of a power semiconductor device and the method of manufacturing such a SiC BJT (or unit cell).

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings, in which:

FIGS. 13A-13F illustrate a method of manufacturing a SiC BJT according to another embodiment of the present invention.

Figure 1:
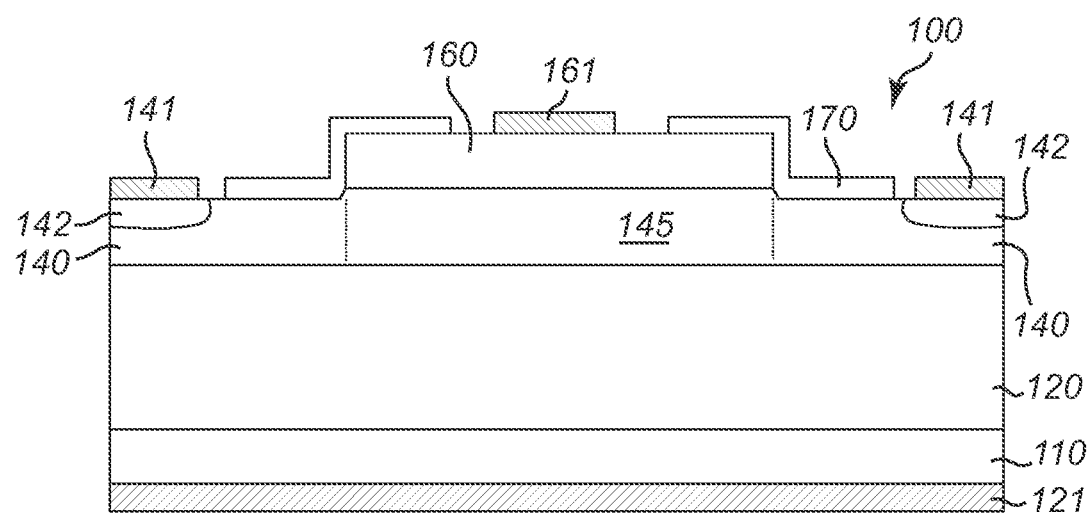
FIG. 1 shows a schematic cross-sectional view of a standard SiC BJT.

All the figures are schematic, not necessarily to scale, and generally only show parts which are necessary in order to elucidate the invention, wherein other parts may be omitted or merely suggested.

DETAILED DESCRIPTION

According to a first aspect of the present invention, there is provided a silicon carbide (SiC) bipolar junction transistor (BJT). The SiC BJT comprises a collector region, a base region and an emitter region arranged as a stack. The emitter region forms an elevated structure defined by outer sidewalls on top of the stack. The portion of the base region interfacing the emitter region defines the intrinsic base portion. Further, the intrinsic base portion comprises a first portion laterally spaced away from the outer sidewalls of the emitter region by a second portion having a dopant dose higher than that of the first portion.

According to a second aspect of the present invention, there is provided a method of manufacturing a SiC BJT including a collector region, a base region and an emitter region arranged as a stack. The method comprises the steps of providing a base layer on a collector layer and providing an emitter region on top of the base layer. The emitter region forms an elevated structure defined by outer sidewalls and the portion of the base layer interfacing the emitter region defines the intrinsic base region (of the base region). The intrinsic base region comprises a first portion laterally spaced away from the outer sidewalls of the emitter region by a second portion having a dopant dose higher than that of the first portion.

It will be appreciated that the collector and base layers form the collector and base regions, respectively, of the SiC BJT.

According to a third aspect of the present invention, a unit cell of a power semiconductor device is provided. The power semiconductor device comprises a first region having a first conductivity type, a second region having a second conductivity type opposite to the first conductivity type, and a third region having the first conductivity type, the first region, the second region and the third region being arranged as a stack. The third region forms an elevated structure defined by outer sidewalls on top of the stack, wherein the portion of the second region interfacing the third region defines an active region of the third region. The active region comprises a first portion laterally spaced away from the outer sidewalls of the third region by a second portion having a dopant dose higher than that of the first portion.

The present invention is based on the understanding that the first portion of the intrinsic base region (or active region) may advantageously be laterally spaced away from the outer sidewalls of the emitter region (or third region) by a second portion (or spacing portion/region) having a higher dopant dose. The inventor has realized that in prior art SiC BJTs the punch-through effect in the base region may principally originate in the zone where the edges of the intrinsic base region and the outer sidewalls of the emitter region coincide. By providing a second portion (or spacing portion) having, in comparison to the first portion of the intrinsic base region, a high dopant dose, the punch-trough effect is reduced. With the present invention, the first portion of the intrinsic base region, which first portion may be referred to as the active portion of the intrinsic base region, does not intersect the outer sidewalls of the emitter region where the punch-through effect is enhanced (due to e.g. over-etching of the emitter region as in prior art BJTs). By laterally spacing the low-dose intrinsic base region (i.e. the first portion) with a certain distance from the outer sidewalls of the emitter region (defined by etching in an emitter layer), an improved blocking voltage is achieved. The lateral boundaries of the first portion do not coincide with the outer sidewalls of the emitter region. During operation (i.e. under application of a bias), the SiC BJT of the present invention presents a higher charge in the second portion than in the first portion of the intrinsic base region.

It will be appreciated that the base layer of a SiC BJT is normally defined by two regions, the intrinsic base region interfacing (or capped by) the emitter region and the extrinsic base region not capped by the emitter region. The outer sidewalls of the emitter region define the boundary limits between these two regions.

According to an embodiment, the first portion of the intrinsic base region may be thinner than at least the second portion, and preferably than the remaining part of the base region (i.e. the part of the base region other than the first portion). In the present embodiment, the first portion of the intrinsic base region may be formed by providing (e.g. via etching) a well in a base layer having a relatively uniform doping level. As the thickness of the base layer is reduced in the first portion of the intrinsic base region, which normally corresponds to the central (or main) portion of the intrinsic base region, the dopant dose (i.e. the integral of the doping level or doping concentration over the thickness) is lower in the first portion than in the second portion. It will be appreciated that the emitter layer is then formed, e.g. by epitaxial deposition, such that material is deposited over the well formed in the base layer and the non-etched part of the base layer, thereby providing an overgrown emitter in the area corresponding to the well. The emitter region and the outer sidewalls of the emitter region are then defined by a subsequent etching step.

According to another embodiment, the second portion may have a doping concentration which is higher than the doping concentration of the first portion, which is an alternative manner of providing an increase dopant dose in the second portion. As a result, the second portion has a dopant dose higher than that of the first portion, thereby reducing the punch-through effect and improving the blocking capability of the SiC BJT. Further, the part of the base region other than the first portion of the intrinsic base region, i.e. the second portion and the extrinsic base region (which is defined as the part of the base region not interfacing or, in other words, not capped by, the emitter region) may have a doping concentration which is higher than that of the first portion.

According to an embodiment, the portion of the base region having a higher dopant dose and including said second portion may extend laterally in the portion of the base region outside (i.e. other than) the intrinsic base region (i.e. in the extrinsic base region, the part of the base region being not capped by the emitter region).

It will be appreciated that, referring to the three preceding embodiments, providing a dopant dose in the extrinsic base region which is higher than the dopant dose of the first portion of the intrinsic base region is advantageous in that an increased charge is then obtained in the extrinsic base region under operation, which further improves the voltage blocking capability while still retaining sufficiently high current gain. In contrast, prior art SiC BJTs have a lower dopant dose in the extrinsic base region than in the intrinsic base region due to the requirement for over-etch of the emitter region (or emitter mesa). Further, in prior art SiC BJTs, additional charge is removed from the extrinsic base region due to the fixed charge in an oxide provided at the edges of the emitter region. An insufficient charge in the extrinsic base region, such as in prior art SiC BJTs, results in increased base resistance as well as in early punch-through of the extrinsic base region, particularly if the dopant dose in the base is kept low so as to achieve high emitter current gain. Thus, "extending the second portion" in the extrinsic base region, i.e. providing a dopant dose in the extrinsic base region which is higher than the dopant dose in the first portion of the intrinsic base region, further improves the SiC BJT in terms of base resistance and blocking capability.

Further, providing an extrinsic base region having a high doping level (at least higher than in the first portion of the intrinsic base region) facilitates formation of an Ohmic contact to the base region.

According to an embodiment, the coverage area of the second portion in the intrinsic base region may be up to about 50% (i.e. may not exceed 50%) and/or the width of the second portion is in the range of about 0.5 to 5 micrometers.

According to an embodiment, the base region may comprise two layers, a first layer interfacing the collector region and a second layer on top of the first layer (i.e. the second layer is arranged at the opposite side of the first layer relative to the collector region). In the present embodiment, the doping level of the first layer is lower than the doping level of the second layer, and the second layer comprises a well extending in direction to (and preferably all the way down to) the first layer for defining the first portion of the intrinsic base region. In the present embodiment, the first portion corresponds to the portion of the first layer located below the well formed in the second layer. The present embodiment is advantageous in that it provides a layer of higher doping level on top of the extrinsic base region, thereby facilitating the fabrication of ohmic contact to the base region and reducing the on-series resistance in the SiC BJT. The SiC BJT as defined in the present embodiment may advantageously be fabricated in accordance with the following manufacturing method.

Referring to the method of manufacturing a SiC BJT in accordance with the second aspect of the present invention, the step of providing a base layer may include the steps of providing a first layer on the collector layer, providing a second layer on top of the first layer and forming, in the second layer, a well extending in direction to the first layer for defining the first portion of the base region in the first layer (e.g. defining the width, length and/or area of the first portion). In the present embodiment, the doping level of the first layer is lower than the doping level of the second layer. Further, the step of providing the emitter region further includes the step of aligning the emitter region on top of the second layer such that the second portion includes material of the second layer. In other words, the first portion of the intrinsic base region is laterally spaced away from the outer sidewalls of the emitter region by a second portion including material of the second layer According to another embodiment, the base region may comprise a layer having a doping level increasing in a step-wise manner and/or in a graded manner along a direction from the collector region to the emitter region. Further, the layer may comprise a well for defining the first portion of the intrinsic base region. The present embodiment is advantageous in that a graded base doping increases the current gain thanks to the drag of minority carriers induced by the built-in electric field. Further, the present embodiment is also advantageous in that a layer of higher doping level is provided on top of the extrinsic base region, thereby facilitating the fabrication of ohmic contact to the base region and reducing the on-series resistance in the SiC BJT. It will be appreciated that the well may extend down to a thickness providing the desired dopant dose in the first portion of the intrinsic base region or down to a thickness corresponding to a desired doping level of the first portion at the interface with the emitter region. The first portion corresponds to the portion of the base layer located below the well formed in the base layer. The SiC BJT as defined in the present embodiment is advantageously fabricated in accordance with the following manufacturing method.

Referring to the method of manufacturing a SiC BJT in accordance with the second aspect of the present invention, the base layer may have a doping level increasing in a step-wise manner and/or in a graded manner from the side of the base region interfacing the collector region towards the emitter region. The method may then further comprise the step of forming a well in the base layer for defining the first portion of the base region (e.g. defining the width, length and/or area of the first portion). Further, the step of providing the emitter region may include the step of aligning the emitter region on top of the base layer such that the second portion includes material of higher doping level than that of the first portion. As a result, the first portion of the intrinsic base region is laterally spaced away from the outer sidewalls of the emitter region by a second portion including material of higher doping level than that of the first portion.

It will be appreciated that, in the SiC BJTs in accordance with the preceding embodiments, the well formed in the base layer comprises material of the emitter region after providing (e.g. by epitaxial deposition) the emitter layer on top of the base layer.

In accordance with yet another embodiment, the base region may comprise two layers, a first layer interfacing the collector region and in which a well is formed for defining the first portion of the intrinsic base region and a second layer arranged on top of the first layer for interfacing the emitter region (i.e. the second layer is arranged at the opposite side of the first layer relative to the collector region). Further, the doping level of the first layer is higher than the doping level of the second layer. One of the advantages of the SiC BJT design according to the present embodiment is the possibility for a more accurate control of the doping level and the thickness of the (low-dose) first portion of the intrinsic base region since the provision (e.g. by epitaxial growth) of the low-doped base layer may immediately be followed by the provision (e.g. by epitaxial growth) of the emitter layer (i.e. without the need of forming a well just before growing the emitter layer). It will be appreciated that the well formed in the first layer does not necessarily need to extend down to the collector region but that a portion of the first layer may be left. In the latter case (i.e. if a portion of the first layer is left), the total charge in the first portion of the intrinsic base region comprises the charge from the portion of the first layer left below the bottom of the well and the charge provided by the second layer, i.e. the overgrown base layer. The SiC BJT as defined in the present embodiment is advantageously fabricated in accordance with the following manufacturing method.

Referring to the method of manufacturing a SiC BJT in accordance with the second aspect of the present invention, the step of providing a base layer may include the steps of providing a first layer on the collector layer, forming a well in the first layer for defining the first portion of the base region (e.g. defining the width, length and/or area of the first portion), and providing a second layer on top of the first layer. In the present embodiment, the doping level of the first layer is higher than the doping level of the second layer. Further, the step of providing the emitter region includes the step of aligning the emitter region on top of the second layer such that the second portion includes material of the first layer. In other words, the first portion of the intrinsic base region is laterally spaced away from the outer sidewalls of the emitter region by a second portion including material of the first layer.

According to an embodiment, the second portion or spacing region (of higher dopant dose) may be formed as stripes extending longitudinally from an outer sidewall of the emitter region towards an opposite sidewall of the emitter region. The present embodiment is advantageous in that it suppresses, or at least reduces, the emitter current crowding effect while a wide emitter stripe may still be used. In general, increasing the width of the emitter region, for improving gain and stability in a BJT has the drawback of increasing the on-state resistance and reducing the switching speed of the device. The (lateral profile of the) collector current density in a BJT is governed by the so-called emitter current crowding effect wherein, at high current levels, the emitter current density rapidly decreases from the edge (or outer sidewalls) of the emitter region towards the center of the emitter region (or stripe). In this case, the contribution of the central part of the emitter region (or mesa) to the collector current is much reduced. A standard solution to reduce the emitter current crowding effect is to reduce the device pitch, i.e. the size (and in particular the width) of the emitter region. However, in SiC, reducing the device pitch increases surface recombination (as the ratio of periphery to device area increases) since the interface of SiC to coating dielectric materials is not as favorable as for e.g. that of silicon to silicon dioxide. An increase of the surface recombination is disadvantageous since it reduces the gain of the BJT and degrades its stability. With the present embodiment, the stripes or "fingers" formed in the high dose portion of the intrinsic base region (i.e. the second portion) are advantageous in that they reduce the emitter current crowding effect without the need of reducing the size of the emitter region.

It will be appreciated that the high-dose base fingers may laterally extend along a direction which is substantially perpendicular to the outer sidewalls of the emitter mesa. The second portion of the intrinsic base region may therefore be provided as a narrow and elongated stripe (or a set of narrow and elongated stripes, which will be further exemplified in the detailed description below).

According to an embodiment, the stack may be provided on a substrate having an off-axis orientation comprised in the range of about 2 to 4 degrees. Further, the SiC BJT may comprise a defect termination layer (DTL) arranged between the substrate and the collector region. The DTL may have a thickness comprised in the range of 12 to 30 micrometers and a doping level comprised in the range of $3 \times 10^{18}$ cm$^{-3}$ to $1 \times 10^{19}$ cm$^{-3}$. The present embodiment is advantageous in that it improves the stability of the SiC BJT. With the DTL, the SiC BJT is less sensitive to degradation in the course of operation due to e.g. propagation of defects such as base plane dislocations.

It will be appreciated that the SiC BJT may further comprise a dielectric coating, such as an oxide, at the sidewalls of the emitter region, and optionally covering also a part of the top portion of the emitter region, which is advantageous in that it reduces surface recombination and thereby further improves the current gain of the SiC BJT.

According to an embodiment of the present invention, the SiC BJT comprises two second portions (having the same conductivity type as the first portion or base region and having a dopant dose higher than a dopant dose of the first portion) laterally surrounding (or being arranged on laterally opposite sides of) the first portion and vertically extending further down in the stack than (or relative to) the first portion. In the following, such second portions are referred to as shielding regions which laterally surround the first portion and vertically extend further down in the stack than (or relative to) the first portion.

Accordingly, in an embodiment of the method according to the second aspect of the present invention, the method may comprise the step of forming two second portions (or shielding regions) having the same conductivity type as the base region and a dopant dose being higher than the dopant dose of the first portion. The shielding regions laterally surround the first portion and vertically extend further down in the stack than the first portion.

With the present embodiment, the first portion may thus be laterally spaced away from the outer sidewalls of the emitter by portions of the shielding regions (which portions thereby act as spacing portions/regions) having a higher dopant dose.

The present embodiment uses the concept of providing an electrostatic shielding of the first portion of the intrinsic base region from the electric field caused by a high collector bias during off-state blocking conditions. During on-state conditions, i.e., when forward bias is applied over the pn junction formed by the emitter region and the base region (the base collector junction being reversed-biased), it is desirable to obtain a high current gain, which may be achieved by reducing the thickness and doping level of the base region. On the other hand, during off-state blocking conditions, it is desirable to obtain a high breakdown electric field (or high blocking voltage) for reducing the punch-through effect, i.e. reducing the risk of the base region being fully depleted. One factor increasing the punch-through effect is a reduced thickness and doping level of the base region. Hence, when determining the doping dose (via the thickness and/or doping level) of the base region, both the performance of the BJT during on-state and blocking conditions have to be considered. With the present embodiment, the punch-through effect is reduced by another factor, namely by the electrostatic shielding of the first portion obtained by the shielding regions, which reduces the risk of the base being fully depleted (punched through) during blocking conditions and thereby increases the blocking voltage of the BJT. With a reduced punch-through effect, the dopant dose (determined by the thickness and/or doping level) of the first portion of the intrinsic base region can be made lower, thereby resulting in an increased emitter current gain. Hence, the present embodiment provides a SiC BJT (and a unit cell) with improved blocking capabilities while still providing a sufficient current gain.

The electrostatic shielding is provided by the shielding regions having the same conductivity type as the first portion and a higher dopant dose than the first portion, which shielding regions laterally surround the first portion and vertically extend further down in the stack than the first portion. The portion of the collector region (the third region) separating the shielding regions, i.e., the portion of the collector region arranged underneath the first portion and between the shielding regions, provides a channel (or opening) facilitating the on-state current flow through the first portion of the intrinsic base region during on-state conditions. Such a portion of the collector region may hereinafter be referred to as a channel portion.

A thinner and lower doped first portion of the base region has a lower Gummel number, i.e., a lower total acceptor charge, and is therefore more permeable to minority carrier diffusion, which increases the base transport factor and the current gain. The first portion of the intrinsic base region may also be referred to as a diffusion-permeable base portion.

In a standard planar BJT design, a thin and low-doped base might be unable to block a high voltage during off-state blocking conditions due to insufficient impurity charge (due to the low dopant dose). With the SiC BJT according to the present embodiment, a higher blocking voltage is achieved by electrostatic shielding of the first portion of the intrinsic base region from the electric field arising (at the base-collector interface) during blocking (off-state operation) conditions.

According to an embodiment, the shielding regions may vertically extend further down in the stack than the first portion by a distance corresponding to about 15% to 150%, preferably about 40% to 60%, and most preferably about 50%, of the width of the portion of the collector region (or third region) separating the shielding regions. The dimensions of the shielding regions and the portion of the collector region separating the shielding regions, i.e. the channel portion, influences the performance of the SiC BJT with respect to the electrostatic shielding during blocking conditions and the channel resistance to vertical current flow during on-state conditions (as the channel resistance is dependent on the cross section area and the thickness of the channel portion). It is desirable to obtain an increased electrostatic shielding during blocking conditions and a sufficiently low channel resistance to vertical current flow during on-state conditions. Shallower shielding regions (i.e. the vertical extension of the shielding regions further down in the stack relative to the vertical extension of the first portion corresponds to a smaller percentage of the width of the channel portion) provides less electrostatic shielding during blocking conditions and less channel resistance during on-state conditions. Deeper shielding regions (i.e. the vertical extension of the shielding regions further down in the stack relative to the vertical extension of the first portion corresponds to a greater percentage of the width of the channel portion) provides more electrostatic shielding during blocking conditions and more channel resistance. The present embodiment is advantageous in that the dimensions of the shielding regions and the channel portion are adapted to provide both an improved electrostatic shielding of the first portion during blocking conditions, thereby reducing the punch-through effect, and a sufficiently low channel resistance of the channel portion during on-state conditions.

According to an embodiment of the present invention, the shielding regions may be epitaxially grown and/or ion implanted regions. Accordingly, in an embodiment of the method according to the second aspect of the present invention, the step of forming the shielding regions may include a step of ion implantation and/or a step of epitaxially growing the shielding regions on the collector layer.

Epitaxially grown shielding regions are advantageous in that they provide higher minority carrier lifetimes in the epitaxially grown material as compared to that obtained by ion implanted regions since it is difficult to completely remove implantation damage in SiC even at the highest practically available temperature of damage annealing. However, ion implanted shielding regions may alternatively be used since the first (low-dose) portion of the intrinsic base region may preferably provide a major part of the minority carrier flow from the emitter region to the collector region due to its lower dopant dose, thereby making the minority carrier flow in the shielding regions less critical. Ion implanted shielding regions are advantageous in that the manufacturing of the SiC BJT is facilitated as it reduces the number of etching and growth steps and operations associated therewith. The ion implantation may be made in portions of the collector region laterally surrounding the first portion, thereby reducing the need of an additional layer for forming the shielding regions. The ion implanted shielding portions may be arranged at each side of the first portion, such that the channel portion of the collector region is laterally surrounded by the ion implanted shielding regions. Further, a combination of epitaxially grown and ion implanted regions may also be used for providing shielding regions with convenient dimensions and dopant doses.

Referring now in particular to the second aspect of the present invention, the method may include the steps of forming an elevated mesa structure in the collector layer and epitaxially growing a shielding layer (i.e. a layer for providing the shielding regions) on the collector layer, whereby an elevated mesa structure is formed in the shielding layer. The method may further include the steps of forming a sacrificial layer on the non-elevated portions of the shielding layer (i.e. the portions laterally surrounding the mesa structure of the shielding layer) and removing the sacrificial layer and the elevated portion of the shielding layer by etching down to the elevated portion of the collector layer. Further, a base layer may be formed on top of the shielding layer and the elevated portion of the collector layer and an emitter layer may be formed on the base layer. The present embodiment is advantageous in that the shielding regions are epitaxially grown, which provides higher minority carrier lifetimes in the shielding regions. According to an embodiment of the present invention, the shielding regions may laterally extend from the first portion outside the intrinsic base region. The shielding regions may thus laterally extend from the first portion into the extrinsic base region of the SiC BJT. The present embodiment is advantageous in that the electrostatic shielding of the first portion is improved due to the increased lateral extension of the shielding regions outside the intrinsic base region.

According to an embodiment of the present invention, the shielding regions may form a part of the base region. The base region may thus comprise a low-dose portion formed by the first portion arranged in the intrinsic base region and a high-dose portion formed by the shielding regions laterally surrounding the low-dose portion.

According to an embodiment, there is provided a SiC power device comprising a plurality of BJTs as defined in any one of the preceding embodiments. The BJTs may be arranged as a one- or two-dimensional array and connected via interconnecting means.

It will be appreciated that the embodiments described above in connection to the first aspect of the present invention are also combinable with any of the embodiments described in connection with the manufacturing method of the second aspect of the present invention, and vice versa.

Further objectives of, features of, and advantages with, the present invention will become apparent when studying the following detailed disclosure, the drawings and the appended claims. Those skilled in the art will realize that different features of the present invention can be combined to create embodiments other than those described in the following.

With reference to FIG. 1, there is shown a schematic view of a standard SiC BJT.

FIG. 1 shows a SiC BJT 100 comprising a substrate 110 on which a collector layer 120, a base layer 140 and an emitter layer 160 have been grown. In the case of a NPN SiC BJT, the epitaxial structure may normally comprise a low-doped n-type collector layer 120 grown on top of a highly doped n-type substrate 110, a p-type base layer 140 and a highly doped n-type emitter layer 160. After epitaxial growth, the emitter region and the base region are defined using dry etch techniques, thereby providing an elevated emitter region 160. A dielectric layer 170 may be formed, e.g. by deposition of an oxide, at the edge of the elevated emitter region 160 (or emitter mesa). The dielectric layer 170 is advantageous for suppressing, or at least reducing, and stabilizing the surface recombination of minority carriers. Ohmic contacts 161 and 141 are formed to the emitter region 160 and the base region 140, respectively, and a collector Ohmic contact 121 may be formed at the back side of the substrate 110. The Ohmic contact 141 to the base region 140 may be improved by providing a region 142 having an increased acceptor doping using e.g. selective ion implantation followed by a subsequent high-temperature anneal before forming the contact 141. The portion of the base layer 140 located under the emitter mesa 160, i.e. within the outline of the emitter edge, is conventionally referred to as the intrinsic base region 145 (or active base region) while the portion of the base layer 140 not capped with the emitter region 160 is conventionally referred to as the extrinsic base region (or passive base region).

High power high speed switching applications require however new designs. In particular, it would be advantageous to provide new designs providing SiC BJTs with improved blocking capabilities while still maintaining a sufficiently high emitter current gain.

Figure 2A:
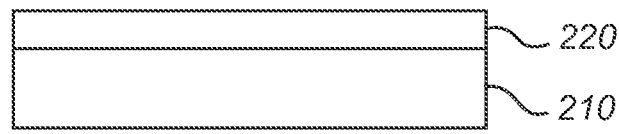
FIG. 2f shows a schematic cross-sectional view of a SiC BJT in accordance with an exemplifying embodiment of the present invention and FIGS. 2a-2f illustrate a method of manufacturing such a SiC BJT.
Figure 2B:
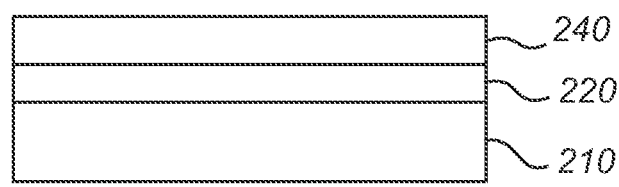
Figure 2C:
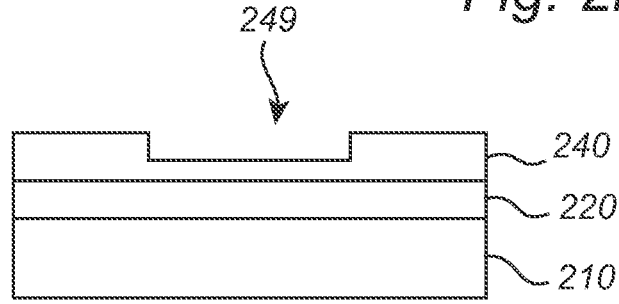
Figure 2D:
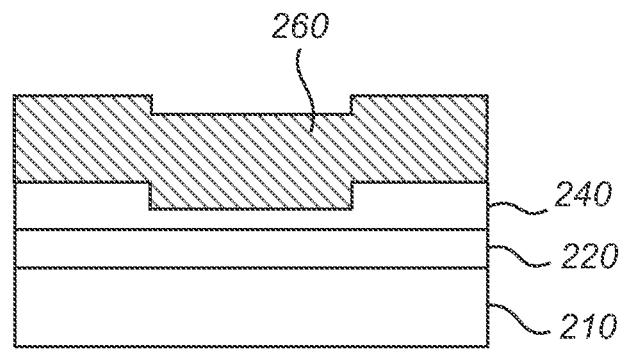
Figure 2E:
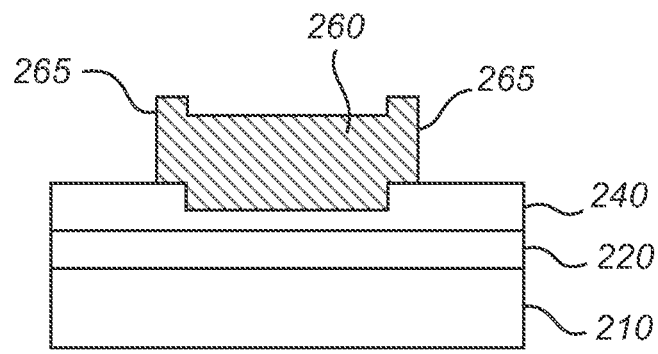
Figure 2F:
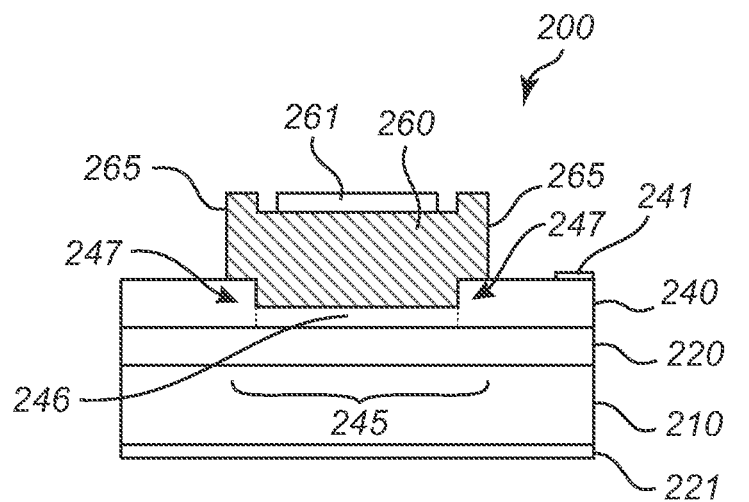

With reference to FIG. 2f, there is shown a schematic view of a SiC BJT in accordance with an exemplifying embodiment of the present invention.

FIG. 2f shows a SiC BJT 200 comprising a substrate 210 on which a collector region 220, a base region 240 and an emitter region 260 are arranged as a stack. The collector region 220, the base region 240 and the emitter region 260 may be grown by epitaxy, as will be further explained below. The SiC BJT shown in FIG. 2f may be a NPN SiC BJT, such as described above in connection to FIG. 1, i.e. with a low-doped n-type collector layer 220 grown on top of a highly doped n-type substrate 210, a p-type base layer 240 and a highly doped n-type emitter layer 260. After patterning (via e.g. photolithography and etching techniques) of the emitter layer, the emitter region 260 forms an elevated structure, or mesa structure, defined by outer sidewalls 265 on top of the stack.

Further, the SiC BJT 200 comprises an intrinsic base region 245, corresponding to the portion 245 of the base region 240 interfacing the emitter region 260 (i.e. the portion of the base region 240 being capped by the emitter region 260), which intrinsic base region 245 includes a first portion 246 laterally spaced away from the outer sidewalls 265 of the emitter region 260 by a second portion 247. The dopant dose of the second portion 247 is higher than the dopant dose of the first portion 246. Although for commodity reasons the reference sign 245 indicating the intrinsic base region has been placed in the substrate 210 on the drawing, it will be appreciated that the intrinsic base region 245 refers to the portion of the base region 240 interfacing the emitter region, as defined above.

In an alternative, such as shown in FIG. 2f, the first portion 246 of the intrinsic base region 245 may be thinner than the remaining part of the base region 240, and in particular the second portion 247. Thus, using a base layer having a relatively uniform doping level, the dopant dose of the base region 240 in the first portion 246, i.e. in its active portion, may be decreased by reducing the thickness of the first portion relative to the remaining part of the base region. As a result, the electrical charge of the first portion is reduced as compared to the electrical charge of the second portion, thereby reducing the risk of punch-through in the vicinity of the outer sidewalls or edges 265 of the emitter region 260 thanks to the second portion 247.

In another alternative, not shown, the dopant dose of the second portion 247 may be increased relative to the dopant dose of the first portion 246 of the intrinsic base region 245 by locally increasing the doping level of the base layer in the second portion 247, and even more advantageously in the second portion 247 and the extrinsic base region of the base region 240.

It will be appreciated that the SiC BTJ shown in FIG. 2f may also include Ohmic contacts to the collector region 220 via e.g. a contact layer 221 at the backside of the substrate 210, a contact layer 241 to the base region 240 and a contact layer 261 to the emitter region 260.

The SiC BJT 200 shown in FIG. 2f may for example be manufactured by a first epitaxial growth of the collector layer 220 on top of the substrate 210 (step corresponding to FIG. 2a) and then epitaxial growth of the base layer 240 on top of the collector layer 220 (step of FIG. 2b). The base layer 240 is then subsequently patterned by etching a well 249 (step of FIG. 2c), e.g. using a combination of photolithography and dry etching techniques, for defining the active (or first) portion 246 of the base region 240. In the present embodiment, the well 249 may extend to a desired thickness, corresponding to a desired dopant dose, of the first portion 246 of the intrinsic base region 245. The manufacturing method then further comprises a step of epitaxial growth of the emitter layer (step of FIG. 2d), thereby covering the bottom surface of the well 249 in the intrinsic base region and the remaining part of the base layer 240 (i.e. the surface which will later correspond to the second portion and the extrinsic base region). The emitter region 260 is then defined using a combination of photolithography and dry etching techniques to form an elevated structure on top of the stack of layers (step of FIG. 2e). The emitter region 260 (i.e. the elevated structure or mesa) is aligned, during the photolithography step, such that the first portion 246 of the intrinsic base region (or in other words the previously defined well 249 in the base layer) is spaced away from the outer edges 265 of the emitter region 260 by the second portion 247, i.e. by a region having a larger thickness than that of the first portion 246. The elevated structure forming the emitter region 260 is defined by outer sidewalls 265.

In other words, the emitter region is patterned in order to avoid or eliminate the risk of intersection of the emitter mesa edges with the active part (first portion) of the intrinsic base region having a lower dose of acceptors. The edges of the first portion 246 of the intrinsic base region 245 do not (laterally) coincide with the outer sidewalls 265 of the emitter region 260, as shown in FIG. 2f.

Referring again to FIG. 1 for further explaining the invention, it will be appreciated that the extrinsic base region of the SiC BJT in accordance with the standard design shown in FIG. 1 has a lower acceptor dose than that of the intrinsic base region since the extrinsic base region is in fact thinner than the intrinsic base region due to the requirement for over-etch of the emitter mesa. Further, an additional acceptor charge is also removed from the extrinsic base due to the fixed charge in the oxide coating 170. An insufficient charge in the extrinsic base results in an increased base resistance as well as in early punch-through of the extrinsic base, particularly if the acceptor dose in the base is kept low so as to achieve high emitter current gain.

The SiC BJT in accordance with the present invention is therefore clearly advantageous over standard SiC BJTs in that they comprise a second portion 247 having a higher dopant dose between the first region 246 of the intrinsic base region 245 and the outer edges 265 of the emitter mesa 260. Further, the region of higher dopant dose may advantageously extend in the extrinsic base region such as shown in FIG. 2f. As a result, the base resistance is decreased and the punch-through effect even further reduced.

It will be appreciated that the second portion 247 of the intrinsic base region 245 may advantageously cover a smaller percentage of the total intrinsic base area as compared to the first portion 246 of the intrinsic base region 245 since the collector current density in the second portion is not as high as that for the first low-dose portion of the intrinsic base region.

Figure 3:
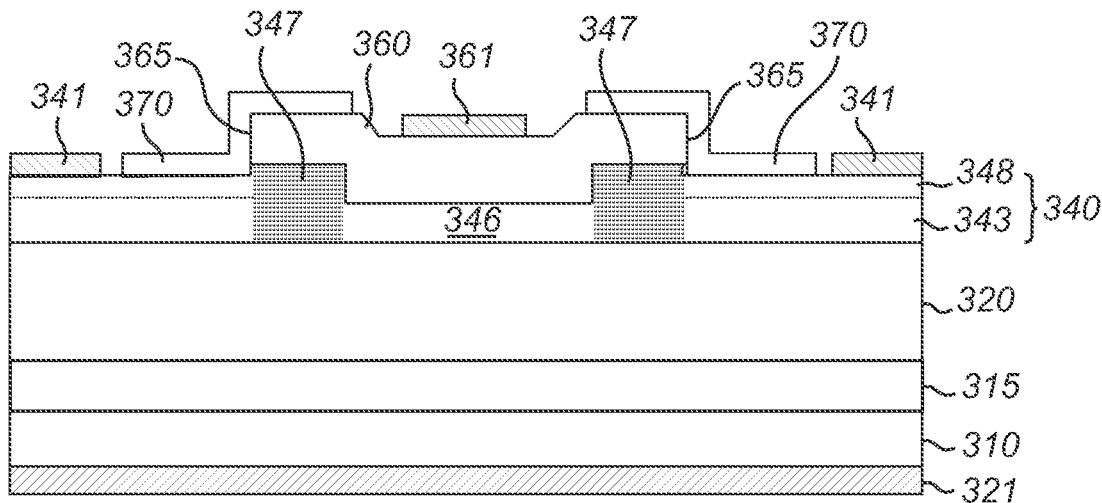
FIG. 3 shows a schematic cross-sectional view of a SiC BJT in accordance with another exemplifying embodiment of the present invention.

With reference to FIG. 3, there is shown a schematic view of a SiC BJT in accordance with another exemplifying embodiment of the present invention.

FIG. 3 shows a SiC BJT 300 comprising a substrate 310 on which a collector region 320, a base region 340 and an emitter region 360 are arranged as a stack. The SiC BJT 300 may be a NPN BJT such as described above with reference to e.g. FIG. 2f.

In the present embodiment, the emitter region 360 of the SiC BJT 300 is epitaxially overgrown on top of a well etched in the base p-type layer 340, such as described above with reference to FIG. 2f. The well in the base layer 340 removes a portion of the acceptor charge to form a zone 346 with a decreased total dose of acceptors, thereby defining the active or first portion 346 of the intrinsic base region 345 in the base layer 340. It will be appreciated that the well may not extend through the entire thickness of the p-type base layer 340 such that the first portion 346 can be defined in the intrinsic base region 345 of the base layer 340. The emitter layer may be deposited on top of the patterned base region using e.g. epitaxial growth, preferably by Chemical Vapor Deposition (CVD). As a result, the emitter layer covers the bottom of the well etched in the base layer 340 and the remaining part of the base layer with a rather homogenous thickness. The emitter region 360 is then defined (using a combination of e.g. photolithography and dry etching techniques) such that the edges of the first portion 346 of the intrinsic base region 345 do not coincide with the outer sidewalls 365 of the emitter region 360. In other words, a second portion or spacing region 347 is formed between the edges of the first portion 346 of the intrinsic base region 345 and the outer sidewalls 365 of the emitter region 360, such as depicted in FIG. 3.

Further, it will be appreciated that the well may only be etched in a zone of the base layer for defining the first portion 346. The portion of the base region having a higher dopant dose, including the second portion 347, may then extend laterally in the extrinsic base region, and preferably in the whole extrinsic base region. As a result, the SiC BJT 300 has an increased charge in the extrinsic base region, which improves the voltage blocking capability while retaining high current gain.

Referring still to FIG. 3, a variety of base doping profiles may be employed. According to a first example, the base layer 340 may comprise two layers. A first layer 343 may be epitaxially grown (e.g. by CVD) on top of the collector layer 320. Subsequently, a second layer 348 may be epitaxially grown (e.g. by CVD) on top of the first layer 343. The second layer 348 may then be etched in an area corresponding to the first portion 346 of the intrinsic base region 345 to be formed in the base layer 340. Such a process may include a step of photolithography (with deposition of a photoresist on top of the second layer followed by exposition to light such as UV and development of the photoresist) to define in a masking layer the area corresponding to the first portion 346 and a step of dry etch to transfer the pattern formed in the masking layer to the second layer 348, and thereby form a well in the second layer 348. The second layer, or top layer, 348 may also be referred to as the base capping layer.

It will be appreciated that the general outline of the method for manufacturing the SiC BJT 300 shown in FIG. 3 are equivalent to that described above with reference to FIG. 2f except that the base layer comprises two layers (as described above). The sequence of process steps may be merely identical and therefore not repeated here.

The depth of the well, i.e. the etch depth, may be adjusted to completely remove the capping layer 348 such that the first portion 346 comprises only material of the first layer 343. The base capping layer 348 may advantageously have an acceptor concentration that is higher than the acceptor concentration of the lower first layer 343. As a result, a region 346 comprising material of the first layer 343 (i.e. having the lower doping concentration) and being thinner than the total base layer 340 (comprising the first layer 343 and the second layer 348) is defined. Such a region is referred to as the first or active portion 346 of the intrinsic base region 345 and has a low dopant dose in comparison to the remaining part of the base layer 340. The thickness (via the etch depth) of the first portion 346 of the base layer 340 and the doping concentration of the first layer 343 are advantageously selected in accordance with a desired blocking voltage and a desired emitter current gain for the SiC BJT 300. The depth of the well may therefore, for some applications, be adjusted to remove only a certain thickness of the capping layer 348. Further, the higher acceptor concentration in the capping layer 348 facilitates the formation of a good Ohmic contact to the base layer 340 and decreases the base resistance.

According to another example, the base layer 340 may be formed as a layer having a graded doping, wherein the acceptor concentration continuously increases upwards, i.e. in the direction from the interface with the collector region 320 towards the interface with the emitter region 360. In the present example, a well is also formed in the base layer 340 for defining the first portion 346 of the intrinsic base region 345, for example in a similar manner as that described above for the preceding example and in connection to FIG. 2f. As another alternative, the base layer may have a doping profile wherein the acceptor concentration increases in the direction from the interface with the collector region 320 to the emitter region 320 (i.e. the opposite side of the base layer) in a stepwise manner. The built-in electric field induced by the graded or stepwise doping profile of the base layer 340 increases the injection of minority carriers, thereby increasing the current gain of the SiC BJT.

It will be appreciated that, although the figures only show a cross-sectional view of the SiC BJT and thereby only show two of the outer sidewalls of the emitter region 360, the emitter stripe has usually finite dimensions and, thus, the additional charge provided at the edges of the intrinsic base region 345 (under the outer sidewalls 365 of the emitter region 360) via the second portion 347 may advantageously be provided at any one of the other edges of the intrinsic base region (and outer sidewalls of the emitter region 360). The first portion 346 of the intrinsic base region 345 having the lowest acceptor charge is advantageously spaced away from any of the outer sidewalls 365 of the emitter region 360.

Turning now to the parameters such as the doping concentration and thickness of the base layer, and in particular of the first portion 346 of the intrinsic base region 345, it will be appreciated that it is preferred if the SiC BJT has a total acceptor dose within the first portion 346 of the base layer 340 that can withstand the maximum electric field without being fully depleted. According to Gauss Law the acceptor dose can be expressed as:

$$Q = \in \times \in_0 \times E_{max}/q \qquad \text{Equation 1}$$

where $E_{max}$ is the maximum electric field, $\in_0$ is the dielectric constant, $\in$ the permittivity of SiC and q is the electron charge. As SiC has a critical field for avalanche breakdown of approximately 2.5 MV/cm, the dopant dose for the low-dose portion of the intrinsic base region, i.e. for the first portion 346 of the base layer 340 (corresponding to the region below the base well), is advantageously equal to a minimum of approximately $1.4 \times 10^{13}$ acceptors per $cm^2$. Further, a high speed power switching device preferably has a non-depleted base portion even at the highest applied voltage, thereby providing a certain margin for the acceptor dose in the first portion 346 of the intrinsic base region 345. The optimal acceptor dose in the first portion 346 of the intrinsic base region 345 may therefore depend on the intended application of the SiC BJT. In certain applications, the emitter current gain might be more significant than the voltage blocking capability and, thus, the optimal acceptor dose in the first portion 346 of the intrinsic base region 345 might be even below $1.4 \times 10^{13}$ $cm^{-2}$. Generally, the acceptor concentration in the first portion 346 of the intrinsic base region 345 (i.e. the low-dose portion 346 of the intrinsic base region 345) may be approximately comprised in the range of $1 \times 10^{17}$ to $5 \times 10^{18}$ atoms per $cm^3$ (cubic centimeter) whereas the thickness of the first portion 346 of the intrinsic base region 345 can be calculated so as to provide the desired dose of acceptor per cm$^2$ (square centimeter).

Turning now to parameters of the emitter region 360, the donor concentration in the emitter region 360 may preferably be about $5 \times 10^{18}$ per cm$^2$ or higher such that a sufficiently high effective Gummel number, which is the product of the average effective donor concentration in the emitter region by the thickness of the emitter region, is achieved since the current gain of a SiC BJT is normally proportional to the effective Gummel number of the emitter region. Regarding the thickness of the emitter region, a thicker emitter is advantageous since it provides a higher Gummel number for the emitter region. Regarding the doping concentration of the emitter region, an optimal value exists since the effective Gummel number starts decreasing with the doping level at very high donor concentrations due to high concentration effects such as energy bandgap lowering. The doping concentration of the emitter region 360 may advantageously not substantially exceed $1 \times 10^{19}$ cm$^{-3}$. However, the topmost portion of the emitter region 360 might be provided with an even higher doping in order to decrease the Ohmic contact resistance at the emitter contact 361 provided on top of the emitter region 360 (see FIG. 3). Unlike the effective Gummel number, the Ohmic contact resistance continuously decreases with an increase of the doping level. The increased doping level of the emitter region 360 under the emitter contact 361 may advantageously not extend too deep in the emitter region (i.e. may cover only a small percentage of the total emitter thickness) in order to prevent any substantial deterioration of the emitter injection properties. The doping level under the emitter contact may reach values up to $2 \times 10^{19}$ cm$^{-3}$ or higher.

Figure 4:
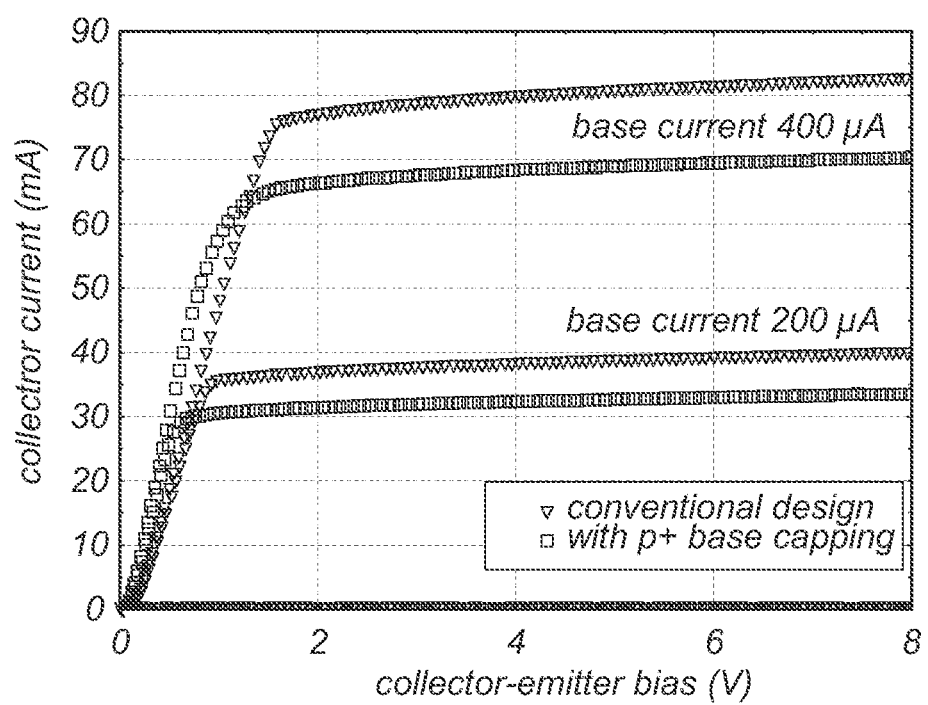
FIG. 4 shows the on-state performance of a SiC BJT in accordance with an embodiment corresponding to the design shown in FIG. 3 for comparison with the on-state performance of a SiC BJT having a standard design (as shown in FIG. 1)
Figure 5:
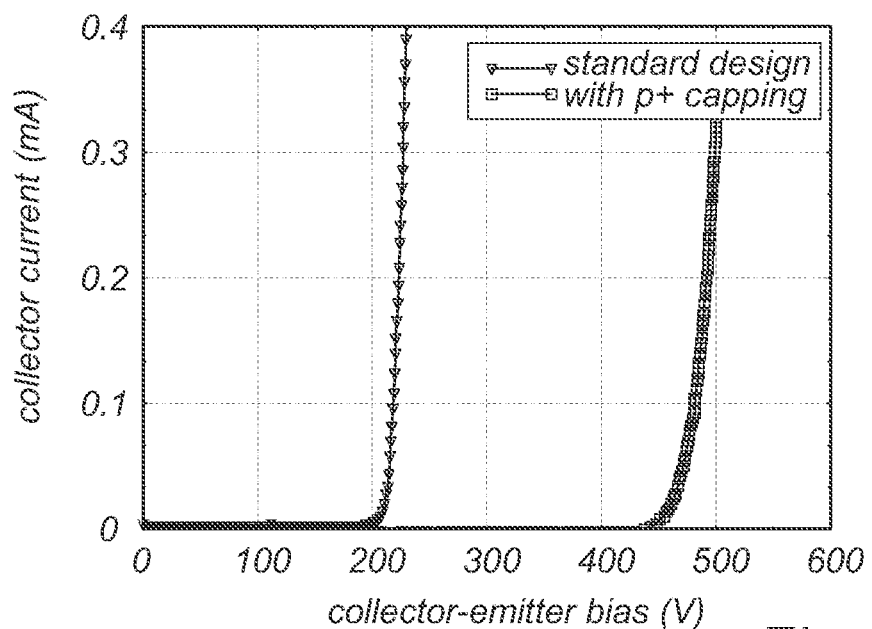
FIG. 5 shows the off-state characteristics of a SiC BJT in accordance with an embodiment corresponding to the design shown in FIG. 3 for comparison with the off-state characteristics of a SiC BJT having a standard design (as shown in FIG. 1)

FIGS. 4 and 5 show the on-state performance illustrating the emitter gain and the off-state performance illustrating the voltage blocking capability, respectively, for a SiC BJT having a design as shown in FIG. 3 (as described in accordance with the above) and for a SiC BJT having a conventional design as shown in FIG. 1. Both devices are fabricated on the same SiC wafer of the 4H hexagonal polytype which is a preferred modification of SiC for high power SiC BJTs due to its high electron mobility and high critical field. Both devices have the same layout of contacts, an emitter periphery of 1 mm and an emitter stripe width of 20 µm. The second portion 347 of the SiC BJT having the design shown in FIG. 3 has a width of 1 µm (or in other words, the overlap of the high-dose base portion with the emitter mesa is 1 µm). Further, the dose for the intrinsic base region of the SiC BJT having the conventional design (FIG. 1) is $7.5 \times 10^{12}$ cm$^{-2}$, which is also the acceptor dose for the first portion 346 of the intrinsic base region 345 of the SiC BJT having the design shown in FIG. 3. The capping layer 348 of the SiC BJT having the design shown in FIG. 3 has an acceptor concentration of $3 \times 10^{18}$ cm$^{-3}$.

In FIGS. 4 and 5, the experimental values obtained for the conventional design (or standard design) are represented by triangles while the experimental values obtained for the SiC BJT in accordance with the embodiment described above with reference to FIG. 3 are represented by squares (called "with p+ capping layer" in the figures). The experimental results are shown for a base current of 200 µA and 400 µA. As can be seen in FIG. 4, the SiC BJT having the design as shown in FIG. 3 has a current gain of 170, which is only marginally lower than that of the SiC BJT having the conventional design. However, the on-state resistance is lower for the SiC BJT having the design shown in FIG. 3, which may be due to a more pronounced collector conductivity modulation. Further, FIG. 5 shows that a significant improvement of the blocking voltage from about 200 V to 450 V may be achieved with the SiC BJT having the design shown in FIG. 3. It will be appreciated that the current gain of SiC BJT having the design shown in FIG. 3 may be further improved and, thus, that the gain may not necessarily be lower than that of the SiC BJT having a conventional design.

Figure 6:
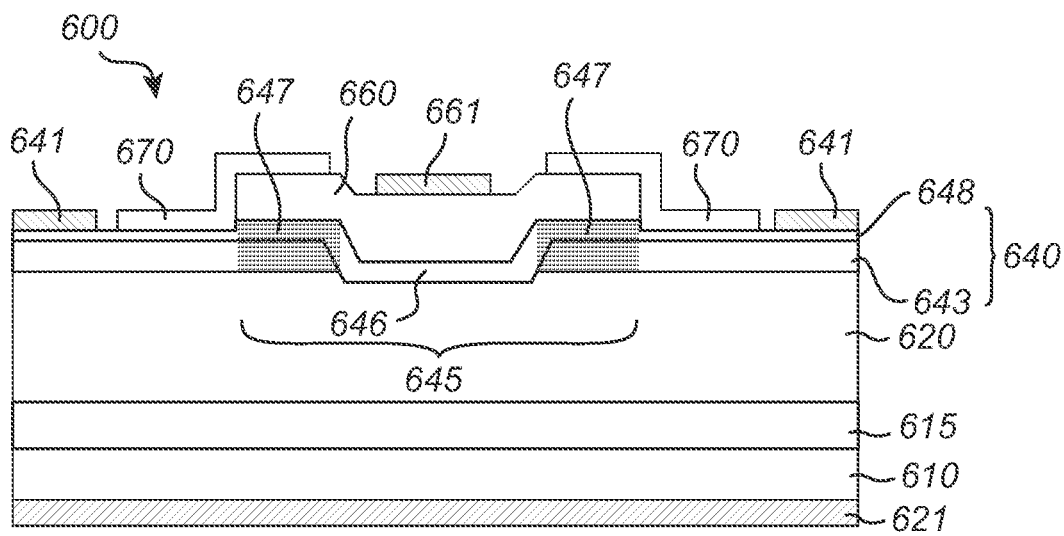
FIG. 6 shows a schematic cross-sectional view of a SiC BJT in accordance with another exemplifying embodiment of the present invention.

With reference to FIG. 6, there is shown a schematic view of a SiC BJT in accordance with another exemplifying embodiment of the present invention.

FIG. 6 shows a SiC BJT 600 comprising a substrate 610 on which a collector region 620, a base region 640 and an emitter region 660 are arranged as a stack. The SiC BJT 600 may be a NPN BJT such as described above with reference to e.g. FIGS. 2 and 3.

In the present embodiment, the first portion 646 of the intrinsic base region 645 of the base layer 640 is overgrown in a well formed in a first layer 643 grown on top of the collector layer 620. For this purpose, the first layer 643 may be epitaxially grown (e.g. by CVD) on top of the collector layer 620. The first layer 643 may then be etched in an area where the first portion 646 of the intrinsic base region 645 is to be located in the base layer 640. Such a process may include a step of photolithography (with deposition of a photoresist on top of the second layer followed by exposition to light such as UV and development of the photoresist) to define in a masking layer the area corresponding to the first portion 646 and a step of dry etch to transfer the pattern formed in the masking layer to the first layer 643, and thereby form a well in the first layer 643. The well formed in the first layer 643 extends down in the direction to the collector region 620 and may extend all the way down to the collector region 620 such as shown in FIG. 6. Subsequently, a second layer 648 may be epitaxially grown (e.g. by CVD) on top of the first layer 643, thereby following the profile patterned in the first layer 643 and filling the well with material of the second layer 648.

An emitter layer may then be deposited on top of the patterned base region using e.g. epitaxial growth, preferably by CVD. As a result, the emitter layer covers the second layer 648 located at the bottom of the well etched in the first layer 643 and the remaining part of the second layer 648 with a rather homogenous thickness. The emitter region 660 is then defined (using a combination of e.g. photolithography and dry etching techniques) such that the (lateral, i.e. vertical in relation to the cross sections shown in the figures) edges of the first portion 646 of the intrinsic base region 645 do not coincide with the outer sidewalls 665 of the emitter region 660. In other words, a second portion 647 of higher dopant dose is formed between the edges of the first portion 646 of the intrinsic base region 645 and the outer sidewalls 665 of the emitter region 660, such as depicted in FIG. 6.

It will be appreciated that the well may not necessarily extend through the entire thickness of the first layer 643 of the p-type base layer 640 such that the first portion 646 can be defined as a superposition of a portion of the first layer 643 and the second layer 648. The total acceptor charge in the first portion 646 (the low-dose zone) of the intrinsic base region 645 then corresponds to the charge in the remaining portion of the first layer 643 at the well bottom and the charge of the overgrown p-type layer 648.

One of the advantages of the SiC BJT design according to the present embodiment is the possibility for a more accurate control of the doping and the thickness of the first portion 646 of the intrinsic base region 645. With this design, it is possible to fabricate a thin and heavily doped intrinsic base without the risk of etching away its substantially high portion, for example, due to SiC material evaporation in the regrowth process wherein a certain amount of SiC may be evaporated during the heat-up stage. With the design according to the present embodiment, the deposition of the second layer 648 is immediately followed by deposition of the emitter layer, which excludes (or at least reduces) the possibility for uncontrolled evaporation. An improved control of the dopant dose enables the fabrication of a SiC BJT with relatively high base doping up to $10^{19}$ cm$^{-3}$. The use of a high base doping is an advantage from the viewpoint of reduced base conductivity modulation under the conditions of high collector current density.

Figure 7:
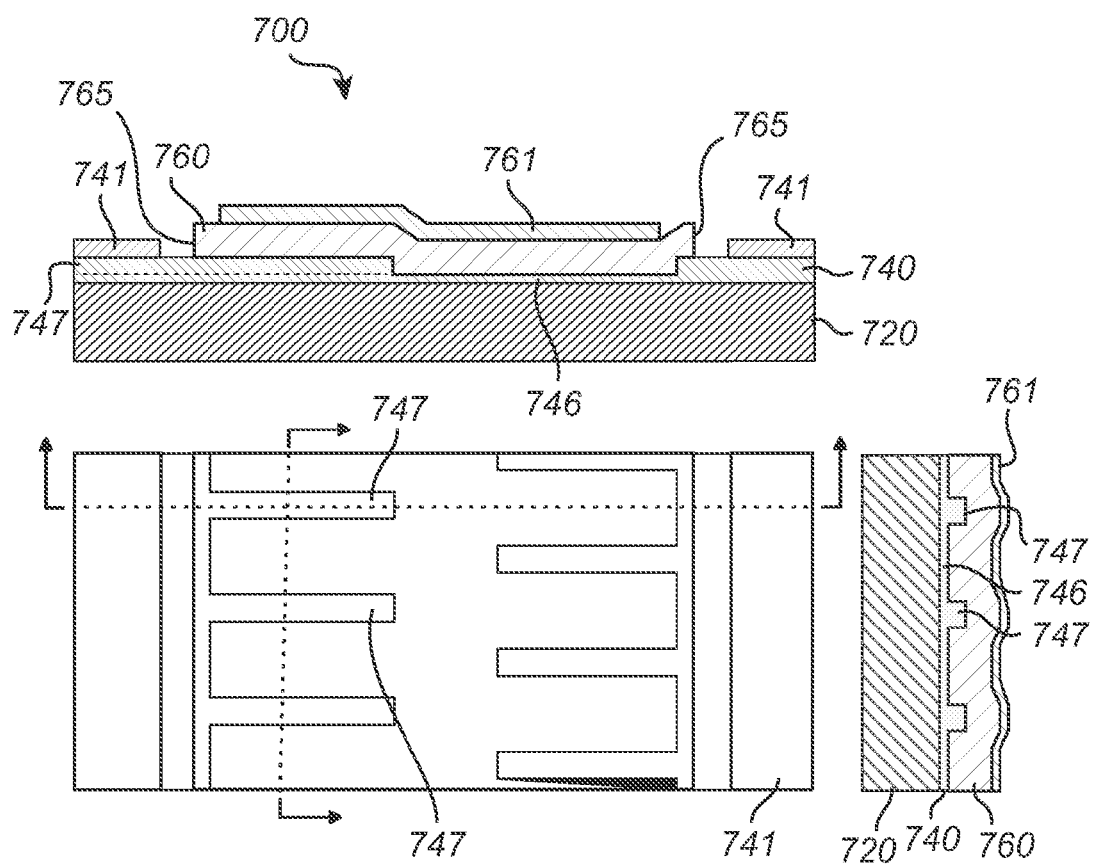
FIG. 7 shows schematic cross-sectional views of a SiC BJT in accordance with yet another exemplifying embodiment of the present invention.

With reference to FIG. 7, there is shown schematic cross-sectional views of a SiC BJT in accordance with another exemplifying embodiment of the present invention.

FIG. 7 shows a SiC BJT 700 which may be equivalent to the SiC BJT 300 described above with reference to FIG. 3 except that the second portion denoted 747 in FIG. 7 is formed as stripes extending longitudinally from an outer sidewall of the emitter region 760 towards an opposite sidewall of the emitter region. For not obscuring the views shown in FIG. 7, not all the elements of the SiC BJT, such as the substrate, the backside contact and the dielectric layer, are shown.

The stripes formed in the second portion 747 of the intrinsic base region and extending from an outer sidewall 765 of the emitter region towards an opposite sidewall form low resistivity p-type fingers in the intrinsic base region. These fingers propagate from an emitter edge towards the center of the emitter stripe and provide means for suppressing the emitter edge crowding effect. The low-resistivity p-type fingers 747 effectively equalize the base-to-emitter potential drop along the cross-section of the emitter mesa and therefore suppress, or at least reduce, the current crowding at the emitter edge.

The potential-equalizing low-resistivity base fingers can be formed in a silicon carbide BJT using the emitter overgrowth technique as described above with reference to FIGS. 2 and 3 wherein the base layer 740 may comprise two layers and wherein a well is etched in a second layer deposited on top of a first layer grown on the collector layer 720. Referring to FIG. 7, a number of wells may be etched in the second layer to form a plurality of fingers. It will be appreciated that the present embodiment is also applicable to a SiC BJT wherein the base layer 740 has a doping profile with an acceptor concentration increasing in a graded or stepwise manner from the interface with the collector region 720 to the emitter region 760. In the present embodiment, the intrinsic base region is shaped so as to form fingers 747, as shown in FIG. 7, having an increased acceptor dose.

The present embodiment is advantageous in that the emitter current crowding effect occurs along the fingers formed in the intrinsic base region, i.e. along the entire serpentine periphery of the high-dose portion of the intrinsic base region (which fingers have a negligible resistance thanks to the high doping concentration). The effective emitter periphery for the SiC BJT 700 according to the present embodiment is therefore substantially higher than the physical periphery of the emitter mesa 760. As a result, the undesirable effect of surface recombination on the current gain of the BJT is reduced as compared to e.g. the conventional BJT design as shown in FIG. 1. Further, the current gain instability due to the instability of the SiC surface properties is substantially improved.

A variety of alternate topologies may be implemented for the stripes (or fingers) formed in the high dose portion of the intrinsic base region. For example, the fingers of the intrinsic base region may have a tapered outline with a finger width decreasing from an emitter edge towards the emitter center. Further, although FIG. 7 shows that the fingers extend only half way from one edge of the emitter region towards the opposite edge, the fingers may propagate all the way between two opposing sidewalls of the emitter region 760.

It will be appreciated that any details related to the selection of the parameters of the base region, such as the doping concentration or the thickness of the first portion 746 (and the second portion 747) of the intrinsic base region of the BJT, described above with reference to FIGS. 2-6 may also apply for the SiC BJT 700 having the design shown in FIG. 7.

Further, the acceptor dose in the second portion 747, i.e. the stripes or fingers 747 of the base region 740, may be selected such that it effectively equalizes the potential of the base over the finger length. In particular, it is preferable if the second portion 747 has an acceptor dose that exceeds the acceptor dose of the first portion 746 of the intrinsic base region by a factor comprised in the range of approximately 1.5 to 20. For example, the base layer 740 may comprise a capping layer with a higher acceptor doping than the first layer deposited on the collector layer 720, as previously described in connection to the embodiment of FIG. 3.

Still referring to FIG. 7, the SiC BJT 700 may be provided with a base contact 741 to the base layer 740 and an emitter contact 761 to the emitter region for electrical connection of the base layer and the emitter region, respectively, such as shown in FIG. 7. As for the embodiment described with reference to FIG. 3, the present embodiment is advantageous in that the base resistance is decreased thanks to the high doping of the capping layer. A specific ion implantation for providing an Ohmic contact to the base layer is therefore not needed.

Further, the present embodiment provides an improvement of the turn-on and turn-off time, especially if the power BJT is optimized for a high current gain. Indeed, at a high collector bias, the major part of the intrinsic base thickness of a standard SiC BJT such as shown in FIG. 1 is depleted, thereby increasing the base resistance and decreasing the switching speed of the device. In contrast, in the present embodiment, the low-resistivity potential-equalizing base fingers of the intrinsic base region are largely non-depleted even at high voltages. Thus, the base resistance will have only marginal dependence on collector bias and the switching capability of the device is improved.

Further, it will be appreciated that the cross sectional views of the SiC BJTs shown in the figures represent a single unit cell of a BJT. A power device may however comprise a plurality of such unit cells, i.e. BJTs such as described in the preceding embodiments, arranged as a one- or two-dimensional array or an array of parallel emitter stripes. The structures (unit cells) of the BJTs comprising a collector region, a base region and an emitter region may be connected together by means of interconnecting means (not shown).

Referring to the embodiments described with reference to FIGS. 3 and 6, the unit cell may have any arbitrary length and any portion of the emitter region along the longitudinal extension of the emitter stripe will have identical cross-section. Referring to the embodiment described with reference to FIG. 7, the unit cell may have a well-defined length such that it is possible to provide a repeating structure with desired lengths of stripes.

Advantageously, referring to any one of the above described embodiments, the power BJT may be formed in hexagonal SiC, and preferably with SiC of the 4H polytype modification, wherein the substrate has a small off-orientation angle from the basal {0001} crystal plane, which is normally between 4 and 8 degrees (but may also be between 2 and 4 degrees in accordance with some embodiments of the present invention, as described below). A certain off-orientation angle is advantageous for obtaining epitaxial layers of sufficiently high quality on SiC since it is more difficult to grow an epitaxial layer that is free from foreign polytype inclusions on on-axis wafers. The epitaxial growth of the emitter region is also advantageously performed on a non-planar substrate since the substrate is patterned to shape the desired structure (i.e. the first portion having a low dopant dose) of the intrinsic base region. The crystal habit of overgrown SiC results in certain restrictions for orientation and dimensions of the BJTs.

Figure 8:
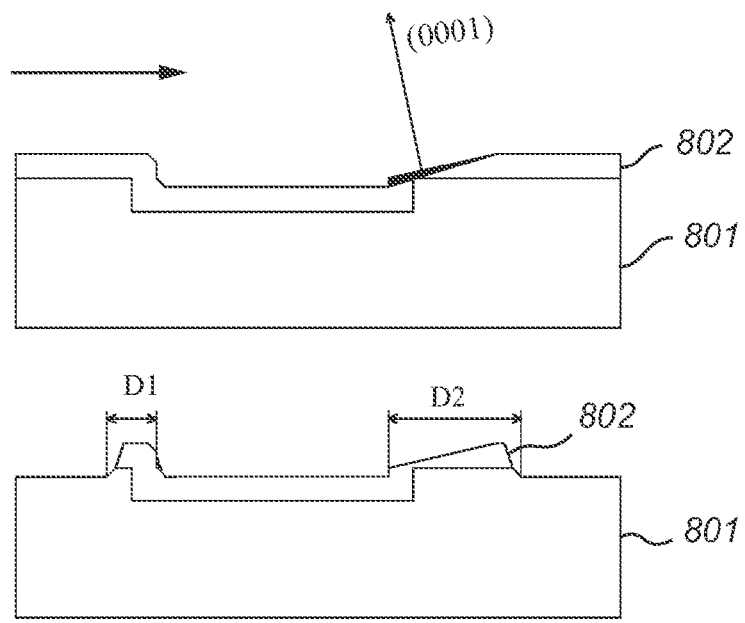
FIG. 8 schematically illustrates the faceting of SiC crystal surface during non-planar overgrowth of a trench and the preferred offsets for etching the emitter region.

Epitaxial overgrowth of SiC generally occurs in a well-behaved conformal manner for certain orientations of a trench edge with respect to the off-orientation direction of the substrate. However, a pronounced crystal faceting may be observed for some orientations as it is illustrated in FIG. 8. The faceting of SiC crystal during non-planar overgrowth is therefore preferably taken into account in the design of a power BJT according to the embodiments of the present invention wherein a well is etched in the base layer for defining the first portion of the intrinsic base region, as described above with reference to FIGS. 2, 3, 6 and 7.

Epitaxial growth on off-oriented substrates of hexagonal SiC generally occurs predominantly due to the flow of growth steps as provided by the off-orientation of the crystal face from the basal {0001} crystal plane. Such growth steps may be in short supply for a trench sidewall opposite to the flow direction, such as illustrated with the horizontal arrow shown in the upper drawing of FIG. 8, wherein a pronounced crystal faceting occurs at the right-hand trench sidewall. The overgrown layer may, in the faceted region, be generally thinner than the layer grown onto the planar portions of the substrate. The maximum width of the faceted region W can be evaluated from the relationship $W=\xi/\sin(\alpha)$, where $\alpha$ is the off-orientation angle (of the substrate) and $\xi$ is the thickness of the overgrown layer. For a faceted sidewall, the offset between the emitter mesa edge and the trench edge, denoted D2 in FIG. 8, may preferably exceed the offset for a non-faceted sidewall, denoted D1 in FIG. 8, by approximately the width of the faceted region, i.e. D2>(D1+W) in width.

In FIG. 8, the upper drawing shows the structure after deposition of an (emitter) layer 802 on a patterned substrate 801 (or patterned SiC wafer) while the lower drawing shows the structure after etching of a mesa or elevated structure in the deposited layer 802.

Further, it is preferred that the emitter stripes are oriented along the off-orientation direction, so that the opposite sides of an emitter stripe are symmetrical from the viewpoint of growth morphology. Positioning the emitter stripes parallel to the off-orientation direction eliminates, or at least reduces, crystal faceting for the direction across the BJT unit cell and reduces the requirement for excessive design margins. An increased design margin may still be preferable at one of the short sides of the emitter stripe in order to reduce the risk of excessive etch into the base region due to emitter surface faceting. However, the increased margin at a shorter side of the emitter stripe will not affect (or at least only a little) the BJT performance since the length of the emitter stripe of a high power BJT is typically hundreds of microns or millimeters, which is much larger than the margin due to the width of the faceted crystal portion W.

Referring again to FIGS. 3 and 6, the SiC BJT may further comprise a defect termination layer, DTL, denoted 315 and 615, respectively, for reducing the risk of bipolar degradation (which may potentially occur in all injection devices made of hexagonal SiC).

Generally, bipolar degradation in SiC results from the growth of stacking faults (SFs) that is induced by minority carrier injection in the device. The SFs may either exist in as-grown material or originate from basal plane dislocations (BPDs), as a result of BPD splitting into Shockley partials. In case of BPD splitting, one of the partials remains bound to the location of the BPD whereas the other partial may travel tens or even hundreds of microns in the device as long as minority carriers are provided to the leading edge of the partial. The glide of a partial dislocation occurs in general within the basal (0001) crystal plane i.e. it forms a certain angle with the substrate surface that is equal to the substrate off-orientation angle. The (0001) plane portion between the two partials will then represent a stacking fault. With an off-orientation of 2 to 8 degrees, even a single stacking fault can have substantially large dimensions.

The stacking faults may form resistive barriers for current flow in the device and create channels for fast minority carrier recombination. The growth of stacking faults may therefore suppress vertical transport of minority carriers in the device and increase the on-state forward voltage drop. In BJTs, stacking faults also degrade the performance. In particular, the growth of SFs increases the on-state resistance and decreases the emitter current gain. A BJT having a stacking fault will then be driven in saturation mode in the regions between the base and the stacking fault as a result of such a barrier, even at voltages that are considerably above the on-state collector-emitter bias ($V_{CEon}$).

The degradation of power BJTs in SiC can be reduced if the BJT structure is grown on a wafer having a low off-orientation angle of about 2 to 4 degrees, and, as shown in e.g. FIG. 3, if a defect termination layer (DTL) 315 is arranged between the substrate 310 and the collector layer 320. The DTL 315 (also denoted 615 in FIG. 6) has a double function. First, it eliminates, or at least reduces, the propagation of BPDs in the BJT since it converts the BPDs into threading edge dislocations. This is advantageous in that threading edge dislocations do not produce stacking faults under the conditions of minority carrier injection. Secondly, the DTL 315 blocks, or at least reduces, the access of minority carriers, which might be present in the collector layer 320 during operation of the BJT 300. Advantageously, the DTL has a doping level (e.g. Nitrogen concentration) comprised in the range of about $2\times10^{18}$ $cm^{-3}$ to $2\times10^{19}$ $cm^{-3}$ and a thickness comprised in the range of about 12 to 30 μm (micrometers). It will be appreciated that thinner layers and lower doping levels of the DTL may fail to substantially prevent the growth of stacking faults from the BPDs (or BPD portions) that are present in the DTL. Further, a too high nitrogen concentration tends to degrade the layer morphology and overall quality.

Experimental results from 10-Ampere SiC BJTs fabricated on a 4-inch SiC wafer and comprising such a DTL are promising. In the experiment, the components (SiC BJTs) had an area of approximately 5.5 mm² and each component was stressed with a base-collector current of 1.4 A at 100° C. for minutes, which is normally sufficient to induce significant bipolar degradation in potentially unstable BJTs. The devices free from degradation after the base-collector stress did not show any signs for bipolar degradation for hundreds of hours of operation and/or under further base-collector stress. Of the approximately 170 fabricated on the 4-inch SiC wafer, only 4 chips had signs of degradation. Any further details about the DTL are further disclosed in Swedish patent application SE1051137-6 and US provisional patent application 61408173 by the same assignee, the disclosure of which is herein enclosed by reference.

Figure 9:
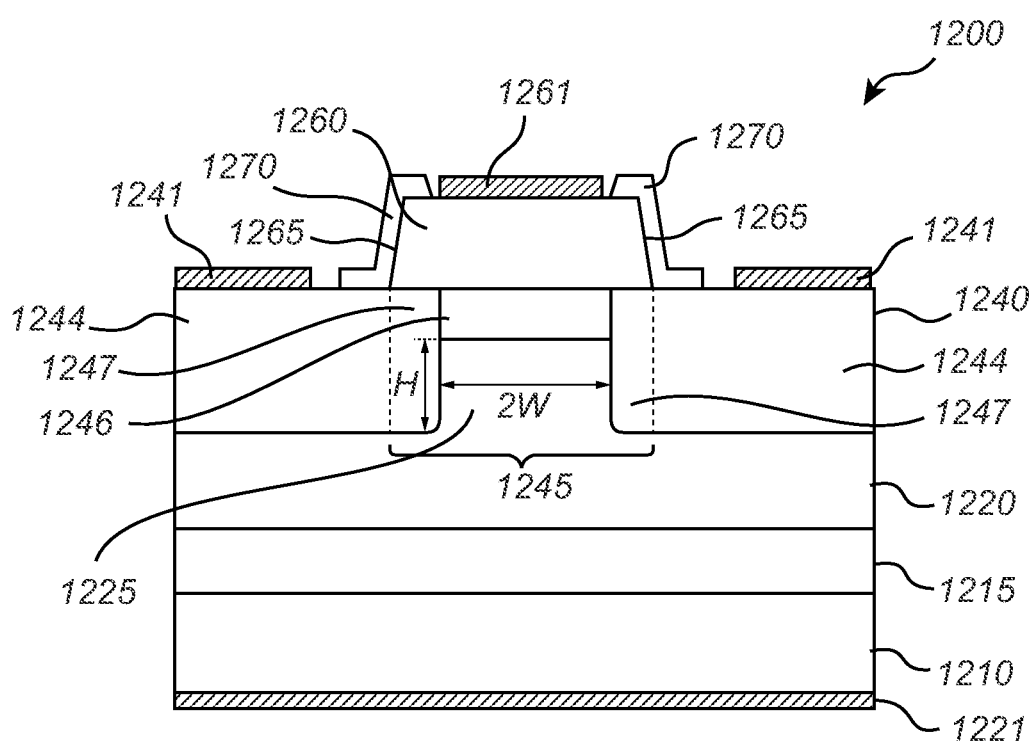
FIG. 9 shows a schematic cross-sectional view of a SiC BJT in accordance with another exemplifying embodiment of the present invention.

With reference to FIG. 9, there is shown a schematic view of a SiC BJT in accordance with an exemplifying embodiment of the present invention. FIG. 9 shows a SiC BJT 1200 comprising a substrate 1210 on which a collector region 1220, a base region 1240 and an emitter region 1260 are arranged as a stack. The collector region 1220, the base region 1240 and the emitter region 1260 may be grown by epitaxy, as will be further explained below. The SiC BJT 1200 shown in FIG. 9 may be a NPN SiC BJT, such as described above in connection to FIG. 1, i.e. with a low-doped n-type collector layer 1220 grown on top of a highly doped n-type substrate 1210, a p-type base layer 1240 and a highly doped n-type emitter layer 1260. After patterning (via e.g. photolithography and etching techniques) of the emitter layer, the emitter region 1260 forms an elevated structure, or mesa structure, defined by outer sidewalls 1265 on top of the stack. Optionally, the SiC BJT 1200 may further comprise a defect termination layer, DTL, 1215 (preferably of n-type) between the substrate 1210 and the collector region 1220 for suppressing bipolar degradation.

Further, the SiC BJT 1200 comprises an intrinsic base region 1245 corresponding to the portion 1245 of the base region 1240 interfacing the emitter region 1260 (i.e. the portion of the base region 1240 being capped by the emitter region 1260), which intrinsic base region 1245 includes a first portion 1246 having a first dopant dose. Although for commodity reasons the reference sign 1245 indicating the intrinsic base region has been placed in the collector region 1220 on the drawing, it will be appreciated that the intrinsic base region 1245 refers to the portion of the base region 1240 interfacing the emitter region 1260, as defined above. The SiC BJT 1200 further comprises two shielding regions 1244 having a second dopant dose being higher than the first dopant dose. The shielding regions 1244 are arranged at laterally opposite sides of the first portion 1246, such that they laterally surround the first portion 1246, and vertically extend further down in the stack than the first portion 1246. As the shielding regions 1244 extend deeper into the collector region 1220 than the first portion 246, an intermediate portion of the collector region 1220 between the shielding regions 1244 provides a channel portion 1225 of the collector region 1220. Hence, the channel portion 1225 is the portion of the collector region 1220 laterally reaching from one shielding region 1244 to the opposite shielding region 1244 and vertically from underneath the first portion 1246 (i.e. the interface between the first portion 1246 and the collector region 1220) to the underside (i.e. the lower boundary) of the shielding regions 1244. The shielding regions 1244 are of the same conductivity type as the first portion 1246, and may preferably form a part of the base region 1240 of the SiC BJT 1200, which in the present example with an NPN SiC BJT means that the shielding regions 1244 are p-type regions. The first portion 1246 of the intrinsic base region 1245 is thus thinner than the remaining part of the base region 1240, and in particular, than the portions of the base region 1240 forming the shielding regions 1244. Thus, using a base layer having a relatively uniform doping level, the dopant dose of the base region 1240 in the first portion 1246, i.e. in its active portion, is decreased by reducing the thickness of the first portion 1246 relative to the shielding regions 1244. As a result, the electrical charge in the first portion 1246 is reduced as compared to the electrical charge in the shielding regions 1244.

During on-state conditions, the current transport will predominantly occur through the channel portion 1225 (i.e. through the opening between two shielding regions 1244) and the first (low-doped) portion 1246 of the intrinsic base region 1245, whereas the contribution of injection current through the shielding regions 1244 (i.e. the high-dose portions of the base region 1240) to the total collector current will be low. A higher current gain of the SiC BJT 1200 may thus be achieved due to the lower doping level of the first portion 1246. The main function of the shielding regions 1244 is to shield the first (low-dose) portion 1246 from the electric field (at the base-collector interface) caused by high collector bias during blocking conditions, whereby the first portion 1246 becomes less depleted, or even non-depleted and the punch-through effect is reduced.

The shielding effect depends on the dimensions of the shielding regions 1244 and the channel portion 1225 defined by the shielding regions 1244. Shallower shielding regions 1244 and a wider channel portion 1225 (W>>H, where H is the height and W is half the width of the channel portion 1225) provide less shielding effect and less channel resistance to vertical current flow, while deeper shielding regions 1244 and a narrower channel portion 1225 (W<<H) provide more shielding effect and more channel resistance to vertical current flow. Therefore, the shielding regions 1244 may vertically extend further down in the stack than the first portion 1246 by a distance corresponding to about 15% to 150%, preferably about 40% to 60%, and most preferably about 50%, of the width of the portion 1225 of the collector region 1220 separating the shielding regions 1244. In other words, the aspect ratio, H/W of the channel portion 1225 may preferably be about ⅓ to 3, and most preferably about 1 for providing both sufficiently high shielding effect and sufficiently low channel resistance.

Figure 10:
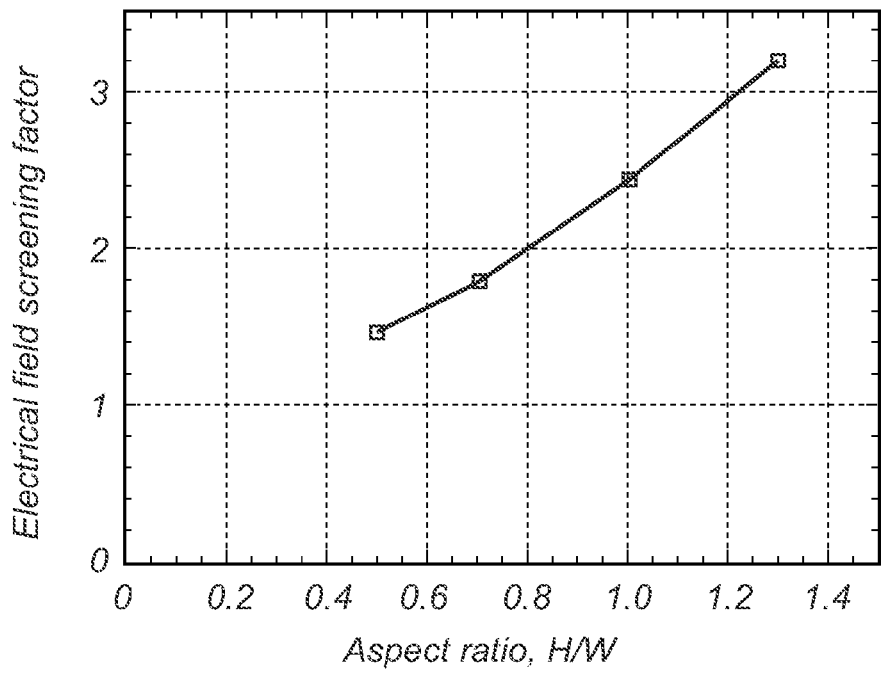
FIG. 10 shows the relation between the electric field screening factor and the aspect ratio of a channel portion of the BJT according to an embodiment of the present invention.

The optimum aspect ratio H/W of the channel portion 1225 however depends on the desired characteristics of the SiC BJT. A higher aspect ratio H/W allows a thinner base region having a lower acceptor doping, whereby a higher current gain is achieved. On the other hand, a lower aspect ratio H/W of the channel portion 1225 results in a lower channel resistance and lower forward voltage drop. Thus, the device characteristics may be adapted according to the desired performance of the SiC BJT. FIG. 10 shows the simulated dependence of the electrical filed screening factor, which represents the efficiency of the shielding action for the shielding regions 1244, as a function of the aspect ratio H/W for a SiC BJT having a 2 μm wide channel portion 225 (i.e., W=1 μm). The electrical field screening factor, which also may be referred to as $F_{scr}$, is the ratio of the maximum electric field in the center of a shielding region 1244 to the maximum electric field in the center of the channel portion 1225. In the simulation illustrated in FIG. 10, the electrical field screening factor was numerically calculated using a commercially available TCAD (Technology CAD) program for a voltage equal to the theoretical avalanche breakdown voltage of the SiC BJT. The thickness and doping of the collector region were set to 10 μm and $9 \times 10^{15}$ cm$^{-3}$, respectively. As can be seen in FIG. 10, the electrical field screening factor, i.e. the shielding effect, increased with an increases aspect ratio H/W. For a conventional SiC BJT (as shown in FIG. 1) the lowest limit for the base dose is determined by the punch-through of the base at a high blocking voltage. According to Gauss Law such a dose is approximately:

$$Q_{aval} = \in \times \in_0 \times E_{aval}/q \quad \text{Equation 2}$$

where $\in_0$ is the dielectric constant, E the permittivity of SiC, q the electron charge and $E_{aval}$ is the avalanche breakdown field, which is in the range of 2-3 MV/cm in SiC for the breakdown voltages relevant for high power devices. $Q_{aval}$ may therefore be in the range between $1.1 \times 10^{13}$ and $1.6 \times 10^{13}$ acceptors per cm$^2$ depending on the required blocking voltage of the base-collector junction.

A conventional SiC BJT using a base acceptor dose lower than $Q_{aval}$ will not reach the theoretical limit for blocking voltage that is set by the avalanche breakdown and the base region will be fully depleted (punched through) at a lower voltage. With the present embodiment, the punch-through effect is however reduced thanks to the shielding regions 1244 and therefore a lower acceptor dose can be used for the first portion 1246 of the base region 1240 with a reduced risk for the base punch-through. The emitter current gain of a BJT has a reciprocal dependence on the acceptor dose in the base region, whereby the SiC BJT according to the present invention has a higher current gain than a conventional SiC BJT while retaining a higher current blocking voltage.

The acceptor dose in the first (low-dose) base portion may be decreased by approximately the factor of $F_{scr}$ as compared to the acceptor dose of a base of a conventional planar SiC BJT. An even greater decrease of the acceptor dose in the base may be achieved if the off-state conditions are maintained by applying reverse bias to the base-emitter junction. The minimum dose of acceptors in the shielding regions 1244 may preferably exceed $Q_{aval}$.

Further, the first portion 1246 may be laterally spaced away from the outer sidewalls 1265 of the emitter region 1260 by portions 1247 of the shielding region 1244, hereinafter referred to as spacing portions 1247, as shown in FIG. 9. As a result of the electrical charge of the first portion 1246 being reduced as compared to the electrical charge of the spacing portion 1247 of the shielding region 1244 (due to the first dopant dose being lower than the second dopant dose) the risk of punch-through in the vicinity of the outer sidewalls or edges 1265 of the emitter region 1260 is reduced thanks to the spacing portions 1247. The dopant dose of the spacing portions 1247 may be further adjusted relative to the dopant dose of the first portion 1246 by adjusting the doping level in the shielding regions 1244, or at least locally adjusting the doping level in the spacing portions 1247 of the shielding regions 1244.

Figure 11:
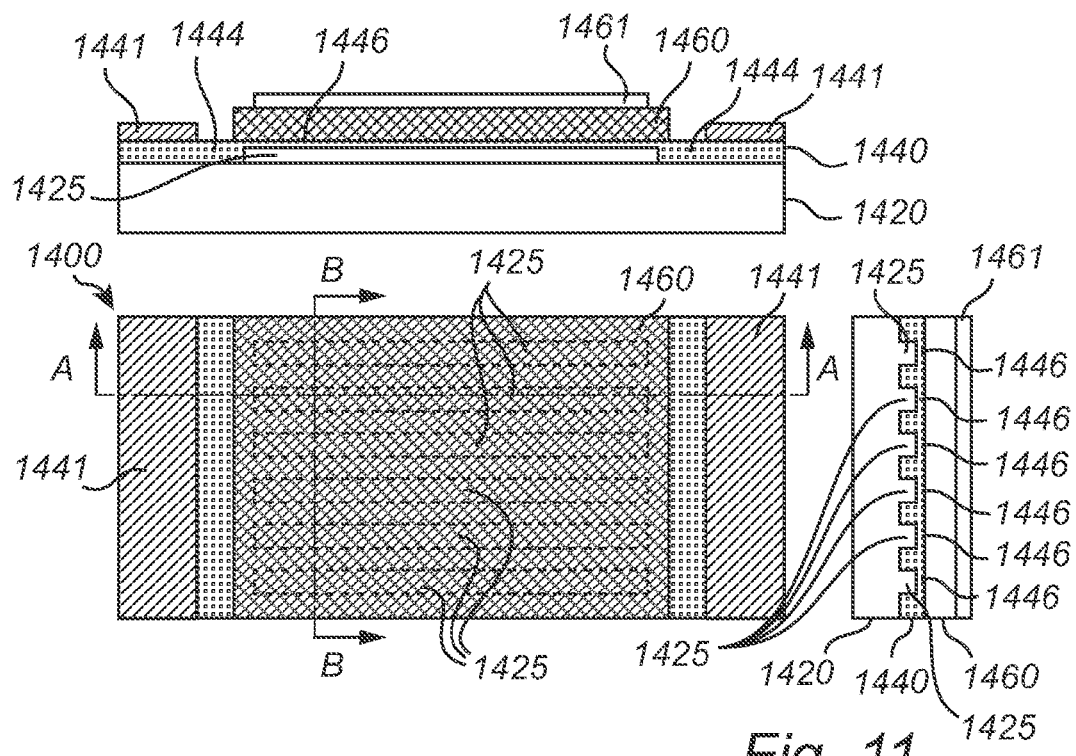
FIG. 11 shows a SiC BJT comprising a plurality of unit cells according to an embodiment of the present invention.

It will be appreciated that the SiC BTJ 1200 may further include Ohmic contacts to the collector region 1220 via e.g. a contact layer 1221 at the backside of the substrate 1210, a contact layer 1241 to the base region 1240 and a contact layer 1261 to the emitter region 1260. Further, a dielectric coating 1270, such as an oxide, may be provided at the sidewalls 1265 of the emitter region 1260, and optionally covering also a part of the top portion of the emitter region 1260, which is advantageous in that it reduces surface recombination and thereby further improves the current gain of the SiC BJT 1200. With reference to FIG. 11, there is shown a schematic view of a SiC power device in accordance with an exemplifying embodiment of the present invention. Cross sectional views are taken along the lines A-A and B-B of the top view (i.e., the lower left illustration).

FIG. 11 shows a SiC power device 1400 comprising a single emitter mesa 1460 used for a plurality of unit cells (BJTs). The structure and the operation principle of each unity cell are the same as the structure and operation principle of the SiC BJT 1200 described with reference to FIG. 9. The SiC power device 1400 comprises a collector layer 1420, a base layer 1440 and an emitter mesa 1460 arranged as a stack. The base layer 1440 comprises a plurality of first portions 1446 formed as stripes underneath the emitter mesa 1460, and shielding regions 1444 laterally surrounding each first portion 1446 and vertically extending further down in the stack than the first portion 1446. Channel portions 1425 are arranged between opposite shielding regions 1444 and underneath each first portion 1446. Each channel portion 1425 is elevated into the base region 1440. The emitter mesa 1460 may preferably be significantly wider than the gap between shielding regions 1444 of adjacent unit cells. The stripes of the first (low-dose) base portions 1446 are oriented substantially perpendicular to the emitter mesa stripe 1460.

Figure 12A:
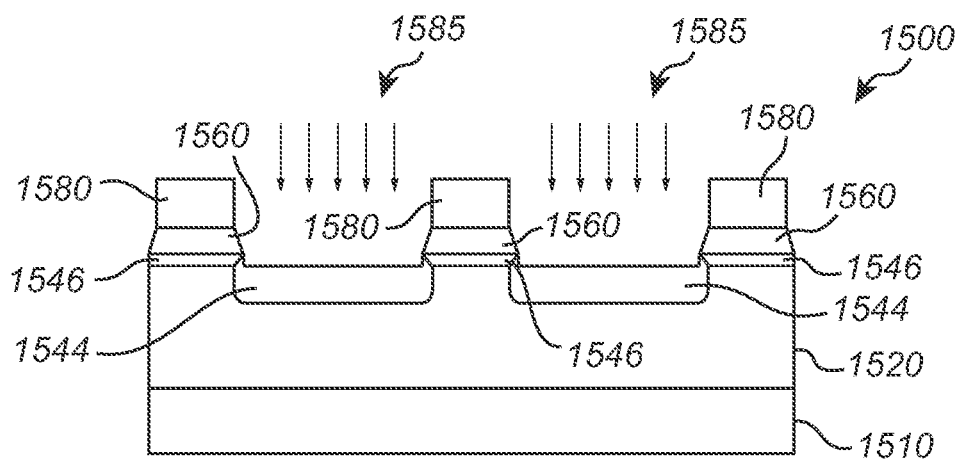
FIGS. 12A and 12B illustrate a method of manufacturing a SiC BJT according to an embodiment of the present invention.
Figure 12B:
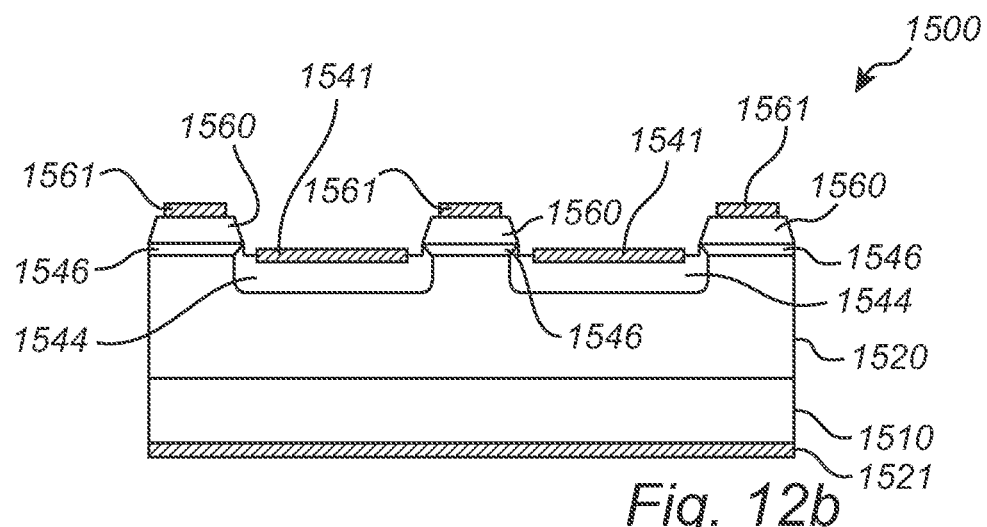

Further, base contacts 1441 and an emitter contact 1461 are provided for electrically connecting the base 1440 and the emitter 1460, respectively. The dielectric passivation layer, the buffer layer, the substrate and the collector contact are omitted in FIG. 11 in order to not obscure the figure. With reference to FIGS. 12A and 12B, a method of manufacturing a SiC BJT according an embodiment of the present invention is illustrated. The basic structure and operation principle of the SiC BJT of FIGS. 12A and 12B are the same as the structure and operation principle of the SiC BJT 1200 described with reference to FIG. 9.

According to the embodiment shown in FIGS. 12A and 12B, the shielding regions 1544 of the SiC BJT 1500 may be formed by ion implantation in the collector region 1520. As shown in FIG. 12A, the emitter regions 1560 may be protected (covered) with an ion implantation mask 1580, and ions (e.g. aluminum ions) may subsequently be implanted into the portions of the collector region 1520 not covered (or capped) by the emitter mesa 1560 and the ion implantation mask 1580. As a result, the shielding regions 1544 are formed by the ion implanted regions of the collector region 1520 laterally surrounding the first portion 1546 of the intrinsic base region and vertically extending further down in the stack (and in the collector region 1520) than the first portion 1546. The ions are then activated by high temperature anneal and base contacts 1541, emitter contacts 1561 and a collector contact 1521 are formed on the shielding regions 1544 (contacting the base region), the emitter regions 1560 and the backside of the substrate 1510 on which the collector region 1520 is disposed, respectively, as shown in FIG. 12B. Electrical connection from the base contacts 1541 to the first portion 1546 is enhanced by the lateral extension of the shielding regions 1544 underneath the emitter mesa. The lateral extension may be provided by the lateral straggle and/or diffusion of implanted acceptor ions. The first portion 1546 of the intrinsic base region may preferably include epitaxial material for enhancing the minority carrier lifetime. The epitaxial first portion 1546 may be provided by epitaxially growing a base layer on the collector layer 1520 (which in turn may be epitaxially grown on a substrate 1510) prior to the ion implantation. The epitaxially grown extrinsic base portions may then, prior to ion implantation, optionally be completely removed by dry etch, or partly removed, wherein the penetration of implanted ions may exceed the thickness of the epitaxial extrinsic base layer (i.e. exceed down into the collector region 1544).

With reference to FIG. 13A-13F, a method of manufacturing a SiC BJT according to another embodiment of the present invention is illustrated. The basic structure and operation principle of the SiC BJT of FIG. 13A-13F are the same as the structure and operation principle of the SiC BJT 1200 described with reference to FIG. 9.

According to the embodiment shown in FIG. 13A-13F, the shielding regions 1644 of the SiC BJT 1600 may be formed by epitaxial growth. An example of a sequence of steps for manufacturing a SiC BJT 1600 comprising such epitaxially grown shielding regions 1644 will be described in the following.

As shown in FIG. 13A, an $n^0$-type collector layer 1620 is epitaxially grown on an $n^+$-type substrate 1610 and subsequently patterned (e.g. by photolithographic technique) and etched for providing an elevated mesa structure 1625 in the collector layer 1620. The elevated mesa structure 1625 is the portion of the collector region 1620, which will become the channel portion 1625 of the SiC BJT 1600 shown in FIG. 13F. Subsequently, a p-type shielding layer 1650 is epitaxially grown on the collector layer 1620, such that an elevated mesa structure 1655 is formed in the shielding layer 1650 (as shown in FIG. 13B). For planarizing the stack formed by the substrate 1610, the collector layer 1620 and the shielding layer 1650, a sacrificial layer 1680 (such as an oxide layer) is deposited on the non-elevated portions of the shielding layer 1650 (as shown in FIG. 13C). The sacrificial layer 1680 and the elevated portion 1655 of the shielding layer 1650 are then removed by etching down to the elevated portion 1625 of the collector layer 1620, which results in a (substantially) plane structure as shown in FIG. 13D. The removal of the elevated portion 1655 of the shielding layer 1650 results in two shielding regions 1644 on opposite sides of the elevated portion 1625 of the collector layer 1620. A p-type base layer 1690 is then deposited on top of the shielding layer 1650 and the elevated portion 1625 of the collector layer 1620, such that the base layer 1690 and the shielding layer together form the base region 1640 of the SiC BJT 1600 (as shown in FIG. 13E). Further, an n⁻-type emitter layer 1667 is deposited on the base layer 1690. The emitter layer 1667 is then patterned and etched to form an emitter mesa 1660 aligned with the elevated portion 1625 of the collector layer 1620 (as shown in FIG. 13F). Hence, the emitter mesa 1660 is positioned over the elevated portion, i.e. the channel portion, 1625 of the collector layer 1620 such that the portion of the base layer 1690 located between the channel portion 1625 and the emitter mesa 1660 forms the first portion 1646 being a part of the intrinsic base region. Preferably, the width of the channel portion 1625 of the collector layer 1620 may be narrower than the emitter mesa 1660, such that portions of the shielding regions 1644 laterally separate the first portion 1646 from the outer edges of the emitter mesa 1660.

The lateral (or substantially vertical) edges of the channel portion 625 may be slightly inclined, as shown in FIG. 13F. In this case, the width at approximately half the height H of the channel portion 1625 may be used for determining a convenient aspect ratio of the channel portion 1625. Generally, if the channel portion has a width varying with its vertical extension, the aspect ratio of the channel portion may preferably be determined based on the average width of the channel portion.

Subsequent manufacturing steps may be identical to those for conventional SiC BJTs.

It will be appreciated that the conductivity types of the different layers may be adapted as desired and that the above described is only an example of conductivity types which may be used for an NPN-type SiC BJT.

Even though the invention has been described with reference to specific exemplifying embodiments thereof, many different alterations, modifications and the like will become apparent for those skilled in the art. The described embodiments are therefore not intended to limit the scope of the invention, as defined by the appended claims. For example, the shielding regions may be both epitaxially grown and ion implanted regions, wherein the SiC BJT may be manufactured by combining the manufacturing steps described with reference to FIGS. 12A and 12B with the manufacturing steps described with reference to FIG. 13A-13F.

Further, the SiC BJT may comprise more than one first portion of the intrinsic base region separated by one or more additional shielding regions. Consequently, the collector region may comprise more than one channel portion, as channel portions thus may be arranged underneath each first portion (and between adjacent shielding regions).

What is claimed is:
1. A silicon carbide (SiC) bipolar junction transistor (BJT), comprising:
a collector region;
a base region; and
an emitter region, the collector region, the base region, and the emitter region being arranged as a stack, the emitter region forming an elevated structure defined by outer sidewalls disposed on the stack,
the base region having a portion interfacing the emitter region and defining an intrinsic base region,
the intrinsic base region including a first portion laterally spaced away from the outer sidewalls of the emitter region by a second portion of the base region having a dopant dose higher than a dopant dose of the first portion.
2. The SiC BJT of claim 1, wherein the first portion of the intrinsic base region is thinner than at least the second portion of the base region.
3. The SiC BJT of claim 1, wherein the second portion of the base region has a doping concentration which is higher than the doping concentration of the first portion of the intrinsic base region.
4. The SiC BJT of claim 1, wherein the second portion extends laterally in the portion of the base region outside the intrinsic base region.
5. The SiC BJT of claim 1, wherein the second portion of the base region has at least one of a coverage area that is less than approximately 50% of an area of the intrinsic base region or a width of approximately 0.5 to 5 microns.
6. The SiC BJT of claim 1, wherein the base region includes a first layer interfacing the collector region and a second layer disposed on the first layer, a doping level of the first layer is lower than a doping level of the second layer, the second layer includes a well extending in a direction toward the first layer, the well defines the first portion of the intrinsic base region.
7. The SiC BJT of claim 1, wherein the base region includes a layer having a doping level increasing in at least one of a stepwise manner or a graded manner along a direction from the collector region toward the emitter region, the layer includes a well defining the first portion of the intrinsic base region.
8. The SiC BJT of claim 1, wherein the base region includes a first layer interfacing the collector region and in which a well is formed for defining the first portion of the intrinsic base region and a second layer arranged on top of said first layer for interfacing said emitter region, wherein a doping level of the first layer is higher than a doping level of the second layer.
9. The SiC BJT of claim 1, further comprising:
a shielding region including the second portion, the shielding region laterally extending from the first portion to a region outside of the intrinsic base region.
10. The SiC BJT of claim 1, further comprising:
a shielding region including the second portion and defining at least a part of the base region.
11. The SiC BJT of claim 1, wherein the stack is disposed on a substrate having an off-axis orientation in a range of about 2 to 4 degrees, the SiC BJT further comprising:
a defect termination layer disposed between the substrate and the collector region, the defect termination layer having a thickness in a range of 12 to 30 micrometers.
12. A silicon carbide (SiC) bipolar junction transistor (BJT), comprising:
a first region having a first conductivity type;
a second region having a second conductivity type opposite the first conductivity type; and a third region having the first conductivity type, the first region, the second region and the third region being arranged as a stack such that the second region is disposed between the first region and the third region, the third region defining an elevated structure defined by an outer sidewall, the second region having a portion interfacing the third region and defining an active region of the second region, the active region including a first portion laterally spaced away from the outer sidewall of the third region by a second portion having a dopant dose higher than that of the first portion.

13. A silicon carbide (SiC) bipolar junction transistor (BJT), comprising:

a collector region;

a base region; and an emitter region disposed on the base region, the emitter region defining an elevated structure defined by an outer sidewall, the base region having an intrinsic base region being capped by the emitter region, the intrinsic base region having a first portion with a dopant dose higher than a dopant dose of a second portion, the first portion and the second portion defining an interface disposed below the emitter region and laterally spaced away from the outer sidewall of the emitter region.

14. The SiC BJT of claim 12, wherein at least a portion of the third region is disposed in a recess of the second region.

15. The SiC BJT of claim 12, further comprising:

a well disposed in the second region between the third region and the first region.

16. The SiC BJT of claim 13, wherein the base region includes a first layer disposed on the collector region and a second layer disposed on top of the first layer, the first portion is included in the first layer of the base region and the second portion is included in the second layer of the base region.

17. The SiC BJT of claim 13, wherein the base region has a doping level increasing in at least one of a stepwise manner or in a graded manner toward the emitter region from a surface of the base region interfacing the collector region.

18. An apparatus, comprising:

a collector region;

a base region; and an emitter region, the base region being disposed between the collector region and the emitter region, the collector region, the base region and the emitter region including silicon carbide (SiC), the emitter region having a portion disposed above a top surface of the base region, the base region having a recessed portion interfacing the emitter region and disposed below the top surface of the base region, the recessed portion of the base region having a width narrower than a width of the portion of the emitter region disposed above the top surface of the base region, the base region having a portion laterally extending from the recessed portion toward a contact zone of the base region, the portion of the base region having a doping concentration higher than the doping concentration of the recessed portion of the base region.

19. The apparatus of claim 18, wherein the recessed portion of the base region and a remaining portion of the base region interfacing the emitter region collectively define an intrinsic base region.

20. The apparatus of claim 18, wherein the portion laterally extending from the recessed portion toward the contact zone of the base region is a first portion, the recessed portion of the base region and the first portion of the base region collectively define an intrinsic base region, the base region has a second portion extending laterally outside of the intrinsic base region.

21. The apparatus of claim 18, wherein the recessed portion of the base region and a remaining portion of the base region interfacing the emitter region collectively define an intrinsic base region, the remaining portion of the base region interfacing the emitter region has at least one of a coverage area that is less than approximately 50% of an area of the intrinsic base region or a width of approximately 0.5 to 5 microns.

22. The apparatus of claim 18, wherein the base region includes a first layer interfacing the collector region and a second layer disposed on the first layer, a doping level of the first layer is lower than a doping level of the second layer, the second layer includes a well extending in a direction toward the first layer, the well defines at least a portion of an intrinsic base region of the base region.

23. The apparatus of claim 18, wherein the base region includes a layer having a doping level increasing in at least one of a stepwise manner or a graded manner along a direction from the collector region toward the emitter region, the layer of the base region includes a well defining at least a portion of an intrinsic base region of the base region.

24. The apparatus of claim 18, wherein the base region includes a first layer interfacing the collector region and a well defining an intrinsic base region of the base region, the base region includes a second layer arranged on top of the first layer interfacing the emitter region, the first layer has a doping level higher than a doping level of the second layer.

25. The apparatus of claim 18, wherein the collector region is disposed on a substrate having an off-axis orientation in a range of about 2 to 4 degrees, the apparatus further comprising:

a defect termination layer disposed between the substrate and the collector region, the defect termination layer having a thickness in a range of 12 to 30 micrometers.

26. The SiC BJT of claim 1, wherein the outer sidewalls of the emitter region are vertically aligned.

27. The SiC BJT of claim 1, wherein the second portion of the base region defines a vertical sidewall in contact with the emitter region.

28. The SiC BJT of claim 1, wherein the base region has a portion surrounding the intrinsic base region and disposed laterally outside of the outer sidewalls of the emitter region.

29. The SiC BJT of claim 12, wherein the outer sidewall of the third region is vertically aligned.

30. The SiC BJT of claim 13, wherein the second portion of the intrinsic base region covers an area of the intrinsic base region smaller than an area of the intrinsic base region covered by the first portion of the intrinsic base region.

31. The SiC BJT of claim 14, wherein the outer sidewall of the third region is vertically aligned, the recess of the second region defines a vertical sidewall.

* * * * *